(12) United States Patent
Ueda et al.

(10) Patent No.: US 10,807,996 B2
(45) Date of Patent: Oct. 20, 2020

(54) MATERIAL FOR ORGANIC ELECTROLUMINESCENT ELEMENT AND ORGANIC ELECTROLUMINESCENT ELEMENT IN WHICH SAME IS USED

(71) Applicant: NIPPON STEEL & SUMIKIN CHEMICAL CO., LTD., Tokyo (JP)

(72) Inventors: Tokiko Ueda, Kitakyushu (JP); Junya Ogawa, Kitakyushu (JP); Takahiro Kai, Kitakyushu (JP); Masashi Tada, Kitakyushu (JP)

(73) Assignee: NIPPON STEEL CHEMICAL & MATERIAL CO., LTD., Tokyo (JP)

( * ) Notice: Subject to any disclaimer, the term of this patent is extended or adjusted under 35 U.S.C. 154(b) by 191 days.

(21) Appl. No.: 15/549,931

(22) PCT Filed: Mar. 8, 2016

(86) PCT No.: PCT/JP2016/057214
§ 371 (c)(1),
(2) Date: Aug. 9, 2017

(87) PCT Pub. No.: WO2016/158246
PCT Pub. Date: Oct. 6, 2016

(65) Prior Publication Data
US 2018/0030068 A1 Feb. 1, 2018

(30) Foreign Application Priority Data
Mar. 30, 2015 (JP) .................................. 2015-070105

(51) Int. Cl.
*C07F 5/02* (2006.01)
*C09K 11/06* (2006.01)
(Continued)

(52) U.S. Cl.
CPC .............. *C07F 5/02* (2013.01); *C09K 11/025* (2013.01); *C09K 11/06* (2013.01); *H01L 51/005* (2013.01); *H01L 51/0067* (2013.01); *H01L 51/50* (2013.01); *C09K 2211/1007* (2013.01); *C09K 2211/1029* (2013.01);
(Continued)

(58) Field of Classification Search
CPC ......... C07F 5/02; C09K 11/025; C09K 11/06; C09K 2211/1007; C09K 2211/1029; C09K 2211/185; H01L 51/005; H01L 51/0067; H01L 51/50; H01L 51/5016; H01L 51/5072; H01L 51/5096; H01L 51/5206; H01L 51/5221
See application file for complete search history.

(56) References Cited

U.S. PATENT DOCUMENTS 6,461,747 B1 * 10/2002 Okada .................. C07D 471/04
252/301.16
2002/0034655 A1 3/2002 Watanabe et al.
(Continued)

FOREIGN PATENT DOCUMENTS

CN 105874626 A 8/2016
EP 2793280 * 10/2014
(Continued)

OTHER PUBLICATIONS

Machine translation for KR 20080015209; publication date: Feb. 2008 (Year: 2008).*
(Continued)

*Primary Examiner* — Dawn L Garrett
(74) *Attorney, Agent, or Firm* — Birch, Stewart, Kolasch & Birch, LLP

(57) ABSTRACT

Provided are an organic electroluminescent device (organic EL device) that is improved in luminous efficiency, sufficiently secures driving stability, and has a simple construction, and a material for an organic EL device to be used in the device. The material for an organic EL device includes a carborane compound represented by the general formula (1), and the carborane compound has a structure in which a six-membered ring group containing at least two nitrogen atoms is bonded to a carborane ring. The material for an organic EL device is suitable as a host material for a light-emitting layer containing a phosphorescent light-emitting dopant and the host material, or as a material for a hole-blocking layer. In the formula, rings A's each represent a divalent carborane group represented by the formula (1a) or the formula (1b), and two or more of X's each represent N.

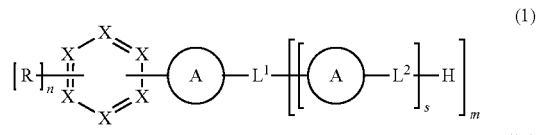

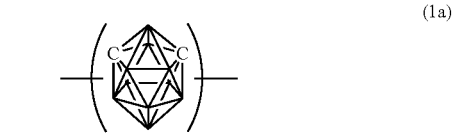

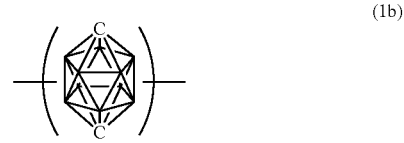

19 Claims, 1 Drawing Sheet

(51) Int. Cl.
*H01L 51/50* (2006.01)
*C09K 11/02* (2006.01)
*H01L 51/00* (2006.01)
*H01L 51/52* (2006.01)

(52) U.S. Cl.
CPC .... *C09K 2211/185* (2013.01); *H01L 51/5016* (2013.01); *H01L 51/5072* (2013.01); *H01L 51/5096* (2013.01); *H01L 51/5206* (2013.01); *H01L 51/5221* (2013.01)

(56) References Cited

U.S. PATENT DOCUMENTS

| | | | |
|---|---|---|---|
| 2012/0319088 | A1 | 12/2012 | Lee et al. |
| 2014/0332792 | A1 | 11/2014 | Tada et al. |
| 2015/0144927 | A1 | 5/2015 | Jin et al. |
| 2016/0315262 | A1 | 10/2016 | Ogawa et al. |
| 2016/0380199 | A1 | 12/2016 | Ogawa et al. |
| 2017/0213974 | A1 | 7/2017 | Adachi et al. |

FOREIGN PATENT DOCUMENTS

| | | | |
|---|---|---|---|
| EP | 3 054 496 A1 | | 8/2016 |
| EP | 3 089 230 A1 | | 11/2016 |
| JP | 2001-313178 A | | 11/2001 |
| JP | 2005-162709 A | | 6/2005 |
| JP | 2005-166574 A | | 6/2005 |
| JP | 2015-103758 A | | 6/2015 |
| JP | 2016-9824 A | | 1/2016 |
| KR | 2008015209 | * | 2/2008 |
| WO | WO 01/41512 A1 | | 6/2001 |
| WO | WO 2013/088934 A1 | | 6/2013 |
| WO | WO 2013/094834 A1 | | 6/2013 |
| WO | WO 2014/103910 A1 | | 7/2014 |
| WO | WO 2015/137202 A1 | | 9/2015 |
| WO | WO 2015/146417 A1 | | 10/2015 |
| WO | WO 2017/143348 | * | 8/2017 |

OTHER PUBLICATIONS

Organometallics (2015), 34(21), pp. 5285-5290. (Year: 2015).*
Australian Journal of Chemistry (2011), 64(11), pp. 1430-1437. (Year: 2011).*
Tetrahedron Letters, (2008), 49(1), pp. 159-164. (Year: 2008).*
Organometallics (2006), 25(12), pp. 2972-2977. (Year: 2006).*
Applied Organometallic Chemistry, (2003), 17(6/7), pp. 539-548. (Year: 2003).*
Machine translation for JP 2005-166574 A; publication date: Jun. 2005 (Year: 2005).*
International Preliminary Report on Patentability dated Oct. 12, 2017, in PCT International Application No. PCT/JP2016/057214.
Wee et al., "Carborane-Based Optoelectronically Active Molecules: Wide Band Gap Host Materials for Blue Phosphorescence," J. Am. Chem. Soc. (2012), vol. 134, pp. 17982-17990.
Exended European Search Report dated Jul. 10, 2018, in European Patent Application No. 16772130.7.

* cited by examiner

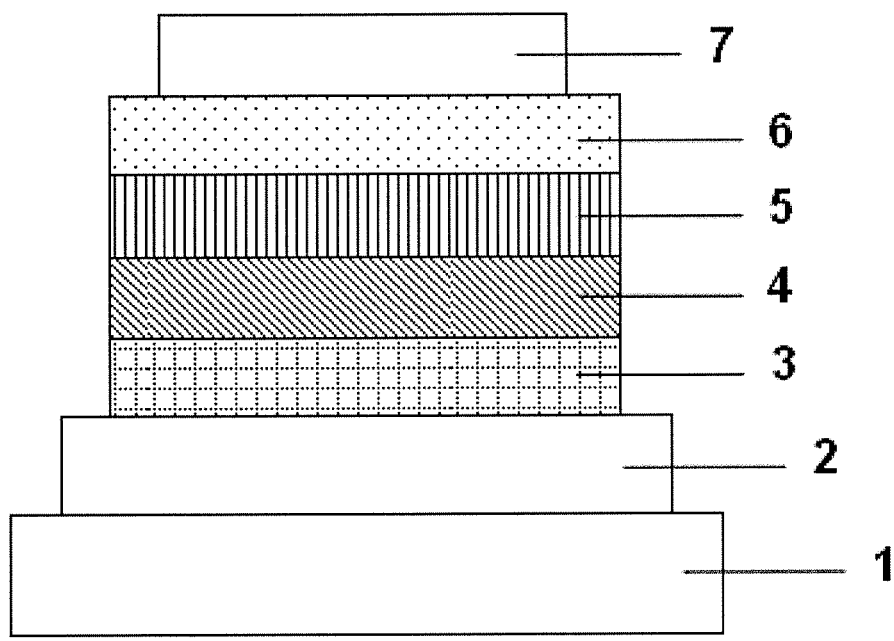

MATERIAL FOR ORGANIC ELECTROLUMINESCENT ELEMENT AND ORGANIC ELECTROLUMINESCENT ELEMENT IN WHICH SAME IS USED

TECHNICAL FIELD

The present invention relates to an organic electroluminescent device using a carborane compound as a material for an organic electroluminescent device, and more specifically, to a thin film-type device that emits light by applying an electric field to a light-emitting layer containing an organic compound.

BACKGROUND ART

In general, an organic electroluminescent device (hereinafter referred to as organic EL device) includes a light-emitting layer and a pair of counter electrodes interposing the light-emitting layer therebetween in its simplest structure. That is, the organic EL device uses the phenomenon that, when an electric field is applied between both the electrodes, electrons are injected from a cathode and holes are injected from an anode, and each electron and each hole recombine in the light-emitting layer to emit light.

In recent years, progress has been made in developing an organic EL device using an organic thin film. In order to enhance luminous efficiency particularly, the optimization of the kind of electrodes has been attempted for the purpose of improving the efficiency of injection of carriers from the electrodes. As a result, there has been developed a device in which a hole-transporting layer formed of an aromatic diamine and a light-emitting layer formed of an 8-hydroxyquinoline aluminum complex ($Alq_3$) are formed between electrodes as thin films, resulting in a significant improvement in luminous efficiency, as compared to related-art devices in which a single crystal of anthracene or the like is used. Thus, the development of the above-mentioned organic EL device has been promoted in order to accomplish its practical application to a high-performance flat panel having features such as self-luminescence and rapid response.

Further, investigations have been made on using phosphorescent light rather than fluorescent light as an attempt to raise the luminous efficiency of a device. Many kinds of devices including the above-mentioned device in which a hole-transporting layer formed of an aromatic diamine and a light-emitting layer formed of $Alq_3$ are formed emit light by using fluorescent light emission. However, by using phosphorescent light emission, that is, by using light emission from a triplet excited state, luminous efficiency is expected to be improved by from about three times to about four times, as compared to the case of using related-art devices in which fluorescent light (singlet) is used. In order to accomplish this purpose, investigations have been made on adopting a coumarin derivative or a benzophenone derivative as a light-emitting layer, but extremely low luminance has only been provided. Further, investigations have been made on using a europium complex as an attempt to use a triplet state, but highly efficient light emission has not been accomplished. In recent years, many investigations have been made mainly on an organic metal complex, for example, an iridium complex for the purpose of attaining high luminous efficiency and a long lifetime, as disclosed in Patent Literature 1.

CITATION LIST

Patent Literature

[PTL 1] WO 01/041512 A1
[PTL 2] JP 2001-313178 A
[PTL 3] JP 2005-162709 A
[PTL 4] JP 2005-166574 A
[PTL 5] US 2012/0319088 A1
[PTL 6] WO 2013/094834 A1

Non Patent Literature

[NPL 1] J. Am. Chem. Soc. 2012, 134, 17982-17990

In order to obtain high luminous efficiency, host materials that are used with the dopant materials described above play an important role. A typical example of the host materials proposed is 4,4'-bis(9-carbazolyl)biphenyl (CBP) as a carbazole compound disclosed in Patent Literature 2. When CBP is used as a host material for a green phosphorescent light-emitting material typified by a tris(2-phenylpyridine) iridium complex ($Ir(ppy)_3$), the injection balance between charges is disturbed because CBP has the characteristic of facilitating the delivery of holes and not facilitating the delivery of electrons. Thus, excessively delivered holes flow out into an electron-transporting layer side, with the result that the luminous efficiency from $Ir(ppy)_3$ lowers.

As described above, in order to provide high luminous efficiency to an organic EL device, it is necessary to use a host material that has high triplet excitation energy, and is striking a good balance in both charge (hole and electron)-injecting/transporting properties. Further desired is a compound that is electrochemically stable and has high heat resistance and excellent amorphous stability, and hence further improvement has been demanded.

In Patent Literatures 3, 4, 5, and 6, and Non Patent Literature 1, there are disclosures of carborane compounds shown below.

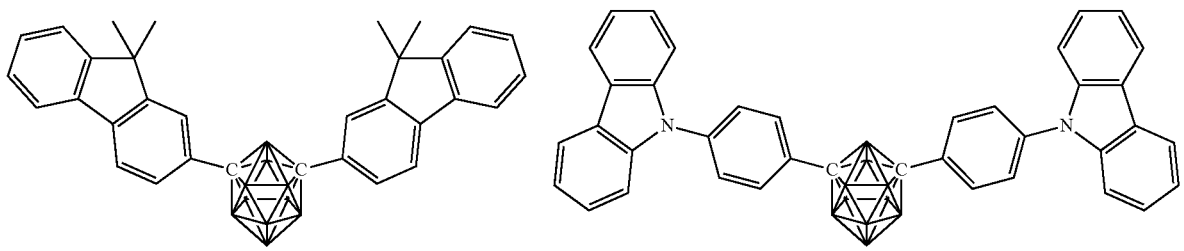

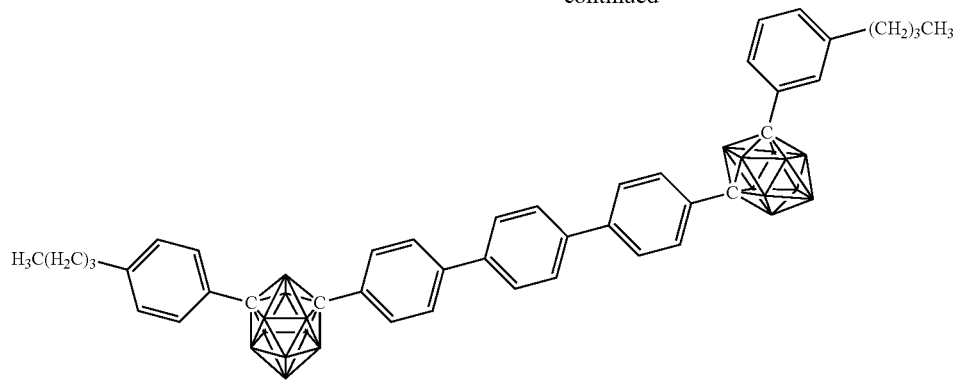

SUMMARY OF INVENTION

In order to apply an organic EL device to a display device in a flat panel display or the like, it is necessary to improve the luminous efficiency of the device and also to ensure sufficiently the stability in driving the device. The present invention has an object to provide, in view of the above-mentioned circumstances, an organic EL device that has high efficiency and high driving stability and is practically useful and a compound suitable for the organic EL device.

The inventors of the present invention have made extensive investigations, and as a result, have found that the use of a compound in which a six-membered ring group containing at least two nitrogen atoms and a carborane skeleton are directly bonded to each other in an organic EL device enables the device to show excellent characteristics. Thus, the inventors have completed the present invention.

The present invention relates to a material for an organic electroluminescent device, including a carborane compound represented by the general formula (1):

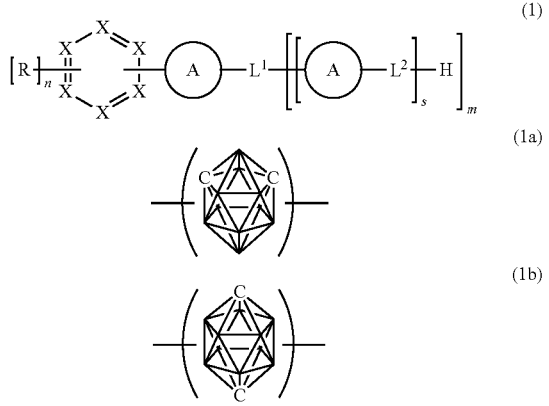

where: rings A's each represent a divalent carborane group $C_2B_{10}H_{10}$ represented by the formula (1a) or the formula (1b), and when a plurality of rings A's are present in a molecule thereof, the plurality of rings A's may be identical to or different from each other, s's each represent a number of repetitions and each represent an integer of from 1 to 4, and m and n each represent a substitution number, and m represents an integer of from 0 to 4, and n represents an integer of from 0 to 3, provided that when m=1, s=1;

X's each represent N, CH, or C, and at least two of X's each represent N;

R represents an alkyl group having 1 to 12 carbon atoms, an alkoxy group having 1 to 12 carbon atoms, a substituted or unsubstituted aromatic hydrocarbon group having 6 to 30 carbon atoms, a substituted or unsubstituted aromatic heterocyclic group having 3 to 16 carbon atoms, or a linked aromatic group formed by linking 2 to 6 aromatic rings of the aromatic hydrocarbon group or the aromatic heterocyclic group;

$L^1$ represents a single bond, or an (m+1)-valent substituted or unsubstituted aromatic hydrocarbon group having 6 to 30 carbon atoms, an (m+1)-valent substituted or unsubstituted aromatic heterocyclic group having 3 to 16 carbon atoms, or an (m+1)-valent linked aromatic group formed by linking 2 to 6 aromatic rings of the aromatic hydrocarbon group or the aromatic heterocyclic group, and when m=1, $L^1$ represents the aromatic heterocyclic group having at least one 1,3,5-triazine ring, pyrimidine ring, pyrazine ring, or pyridazine ring, or the linked aromatic group, or a single bond, and $L^1$-H at a terminal may represent an alkyl group having 1 to 12 carbon atoms or an alkoxy group having 1 to 12 carbon atoms; and $L^2$'s each independently represent a single bond, or a divalent substituted or unsubstituted aromatic hydrocarbon group having 6 to 30 carbon atoms, a divalent substituted or unsubstituted aromatic heterocyclic group having 3 to 16 carbon atoms, or a divalent linked aromatic group formed by linking 2 to 6 aromatic rings of the aromatic hydrocarbon group or the aromatic heterocyclic group, and $L^2$-H at a terminal may represent an alkyl group having 1 to 12 carbon atoms or an alkoxy group having 1 to 12 carbon atoms, and when a plurality of $L^2$'s are present in a molecule thereof, the plurality of $L^2$'s may be identical to or different from each other, provided that in each of $L^1$ and $L^2$, a ring to be directly bonded to the ring A is not a dibenzothiophene ring, a dibenzofuran ring, or a bicyclic nitrogen-containing heterocycle represented by the following formula (2):

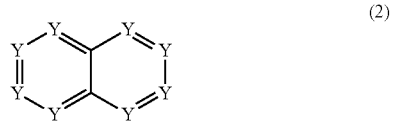

where Y's each independently represent N, CH, or C, and one to four of Y's each represent N.

In addition, in the case of a linked aromatic group, the group may be linear or branched, and its aromatic rings to be linked may be identical to or different from each other.

A preferred mode of the present invention is described below.

In the general formula (1), one or more of the following 1) to 4) are satisfied:
1) the rings A's each represent a divalent carborane group $C_2B_{10}H_{10}$ represented by the formula (1a);
2) $L^1$ and $L^2$ each independently represent a single bond, or a substituted or unsubstituted aromatic hydrocarbon group having 6 to 30 carbon atoms, a substituted or unsubstituted aromatic heterocyclic group having 3 to 16 carbon atoms, or a linked aromatic group formed by linking 2 to 6 aromatic rings of the aromatic hydrocarbon group or the aromatic heterocyclic group;
3) $L^1$ and $L^2$ each independently represent a single bond, or a substituted or unsubstituted aromatic hydrocarbon group having 6 to 30 carbon atoms, or a linked aromatic group formed by linking 2 to 6 aromatic rings selected from the aromatic hydrocarbon groups; and
4) m represents an integer of 0 or from 1 to 4, preferably an integer of 0 or 1.

Part or all of hydrogen atoms in the carborane compound represented by the general formula (1) may each be substituted with a deuterium atom.

The present invention also relates to an organic electroluminescent device having a structure in which an anode, an organic layer, and a cathode are laminated on a substrate, the organic layer including an organic layer containing the above-mentioned material for an organic electroluminescent device.

Further, it is preferred that the organic layer containing the material for an organic electroluminescent device include a light-emitting layer containing a phosphorescent light-emitting dopant.

The material for an organic electroluminescent device of the present invention has a structure in which a six-membered ring aromatic group containing at least two nitrogen atoms and a carborane skeleton are directly bonded to each other. The carborane compound having such structural feature is improved in electron-injecting and transporting properties because its lowest unoccupied molecular orbital (LUMO) that affects the electron-injecting and transporting properties is widely distributed on its nitrogen-containing six-membered aromatic ring having satisfactory electron resistance. Further, the electron-injecting and transporting properties can be controlled at higher levels by changing R with which the ring is substituted. By virtue of the foregoing features, the use of the material in an organic EL device can achieve a reduction in driving voltage of the device and high luminous efficiency.

BRIEF DESCRIPTION OF DRAWINGS

The FIGURE is a sectional view for illustrating one structural example of an organic EL device.

DESCRIPTION OF EMBODIMENTS

A material for an organic electroluminescent device of the present invention is represented by the general formula (1).

Here, rings A's each represent a carborane group, and an aromatic ring formed of six X's is a nitrogen-containing six-membered ring group containing at least two nitrogen atoms. The aromatic ring formed of six X's in the general formula (1) is hereinafter sometimes referred to as "aromatic ring formed of X's."

In the general formula (1), when the same symbols are present in plurality, the symbols may be identical to or different from each other. For example, not only the rings A's and X's that are present in plurality in a molecule of the material but also $L^2$'s, R's, or the like that may be present in plurality in accordance with a number represented by n, s, or m may be identical to or different from each other.

In the general formula (1), the rings A's each represent a divalent carborane group $C_2B_{10}H_{10}$ represented by the formula (1a) or (1b). The rings each preferably represent a carborane group represented by the formula (1a). When the plurality of rings A's are present in a molecule thereof, the rings may be identical to or different from each other, but both the rings each preferably represent a carborane group represented by the formula (1a). The two bonding hands of the formula (1a) or (1b) may appear from C or may appear from B, but a bonding hand to be bonded to L or $L^2$ preferably appears from C.

$L^1$ represents a single bond, or an (m+1)-valent substituted or unsubstituted aromatic hydrocarbon group having 6 to 30 carbon atoms, an (m+1)-valent substituted or unsubstituted aromatic heterocyclic group having 3 to 16 carbon atoms, or an (m+1)-valent linked aromatic group formed by linking 2 to 6 aromatic rings of the aromatic hydrocarbon group or the aromatic heterocyclic group, and in the case of the linked aromatic group, the group may be linear or branched, and its aromatic rings to be linked may be identical to or different from each other, provided that when m=1, $L^1$ represents the aromatic heterocyclic group having a 1,3,5-triazine ring, a pyrimidine ring, a pyrazine ring, or a pyridazine ring, or the linked aromatic group containing at least one of the rings, or a single bond.

$L^2$ represents a single bond, or a divalent substituted or unsubstituted aromatic hydrocarbon group having 6 to 30 carbon atoms, a divalent substituted or unsubstituted aromatic heterocyclic group having 3 to 16 carbon atoms, or a divalent linked aromatic group formed by linking 2 to 6 aromatic rings of the aromatic hydrocarbon group or the aromatic heterocyclic group, and in the case of the linked aromatic group, the group may be linear or branched, and its aromatic rings to be linked may be identical to or different from each other. In addition, $L^1$-H or $L^2$-H at a terminal may represent an alkyl group having 1 to 12 carbon atoms or an alkoxy group having 1 to 12 carbon atoms.

However, in each of $L^1$ and $L^2$, a ring to be directly bonded to the ring A is not a dibenzothiophene ring, a dibenzofuran ring, or a bicyclic nitrogen-containing heterocycle represented by the formula (2).

The term "ring to be directly bonded to the ring A" as used herein refers to *Ar or *Ar1 when L or $L^2$ represents an aromatic group (*Ar) or when $L^1$ or $L^2$ represents a linked aromatic group (*Ar1-Ar2-Ar3). Here, *Ar and *Ar1 each represent an aromatic ring to be directly bonded to the ring A (carborane group). The ring may have a substituent.

The bicyclic nitrogen-containing heterocycle represented by the formula (2), the dibenzothiophene ring, and the dibenzofuran ring are represented by the following formulae. Y's each independently represent N, CH, or C, and one to four of Y's each represent N, and any one of the carbon atoms has a bonding hand.

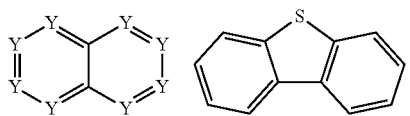

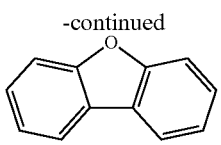

L¹ and L² each preferably represent a single bond, or a substituted or unsubstituted aromatic hydrocarbon group having 6 to 30 carbon atoms, a substituted or unsubstituted aromatic heterocyclic group having 3 to 16 carbon atoms, or a linked aromatic group formed by linking 2 to 6 aromatic rings of the aromatic hydrocarbon group or the aromatic heterocyclic group, and each more preferably represent a single bond, or a substituted or unsubstituted aromatic hydrocarbon group having 6 to 30 carbon atoms, or a linked aromatic group formed by linking 2 to 6 aromatic rings of the aromatic hydrocarbon group.

R represents a hydrogen atom, an alkyl group having 1 to 12 carbon atoms, an alkoxy group having 1 to 12 carbon atoms, or a substituted or unsubstituted aromatic hydrocarbon group having 6 to 30 carbon atoms, a substituted or unsubstituted aromatic heterocyclic group having 3 to 16 carbon atoms, or a linked aromatic group formed by linking 2 to 6 aromatic rings of the aromatic hydrocarbon group or the aromatic heterocyclic group, and in the case of the linked aromatic group, the group may be linear or branched, and its aromatic rings to be linked may be identical to or different from each other.

In the descriptions of L¹, L², and R, descriptions concerning an aromatic hydrocarbon group, an aromatic heterocyclic group, and a linked aromatic group are common except that L¹ represents an (m+1)-valent group, L² represents a divalent group, and R represents a monovalent group.

Specific examples of the unsubstituted aromatic hydrocarbon group include groups each produced by removing a hydrogen atom from an aromatic hydrocarbon compound, such as benzene, naphthalene, fluorene, anthracene, anthryl, phenanthrene, triphenylene, tetraphenylene, fluoranthene, pyrene, or chrysene. Of those, a group produced by removing a hydrogen atom from benzene, naphthalene, fluorene, phenanthrene, or triphenylene is preferred.

Specific examples of the unsubstituted aromatic heterocyclic group include groups each produced by removing a hydrogen atom from an aromatic heterocyclic compound, such as pyridine, pyrimidine, pyrazine, pyridazine, triazine, quinoline, isoquinoline, quinoxaline, naphthyridine, carbazole, acridine, azepine, tribenzazepine, phenazine, dibenzofuran, dibenzothiophene, diazafluorene, phenoxazine, phenothiazine, dibenzophosphole, or dibenzoborole. Of those, a group produced by removing a hydrogen atom from pyridine, pyrimidine, triazine, dibenzofuran, dibenzothiophene, or carbazole is preferred.

The term "linked aromatic group" as used herein refers to a group produced by removing a hydrogen atom from an aromatic compound in which a plurality of aromatic hydrocarbon compounds or aromatic heterocyclic compounds are linked to each other. The linked aromatic group is a group formed by linking 2 to 6 aromatic rings through direct bonding, and the aromatic rings to be linked may be identical to or different from each other, and may include both an aromatic hydrocarbon group and an aromatic heterocyclic group. The number of the aromatic rings to be linked is preferably from 2 to 4, more preferably 2 or 3. The numbers of carbon atoms of the aromatic hydrocarbon group and the aromatic heterocyclic group to be linked fall within the ranges of the numbers of carbon atoms of the aromatic hydrocarbon group and the aromatic heterocyclic group described above, and the total number of carbon atoms thereof preferably falls within the range of from 6 to 50.

The term "aromatic ring" as used herein means an aromatic ring of an aromatic hydrocarbon compound or an aromatic heterocyclic compound, and the term "aromatic group" as used herein means an aromatic hydrocarbon group, an aromatic heterocyclic group, or a linked aromatic group. When an aromatic hydrocarbon group or an aromatic heterocyclic group and a linked aromatic group are distinguished from each other, the aromatic hydrocarbon group or the aromatic heterocyclic group does not have an aromatic hydrocarbon group or an aromatic heterocyclic group to be bonded thereto through a single bond.

Specific examples of the linked aromatic group include groups each produced by removing a hydrogen atom from biphenyl, terphenyl, phenylnaphthalene, diphenylnaphthalene, phenylanthracene, diphenylanthracene, diphenylfluorene, bipyridine, bipyrimidine, bitriazine, biscarbazole, phenylpyridine, phenylpyrimidine, phenyltriazine, phenylcarbazole, diphenylpyridine, diphenyltriazine, bis(carbazolyl)benzene, or the like.

When the linked aromatic group is a divalent group, the group is represented by, for example, any one of the following formulae, and its rings may be linked in a linear manner or a branched manner:

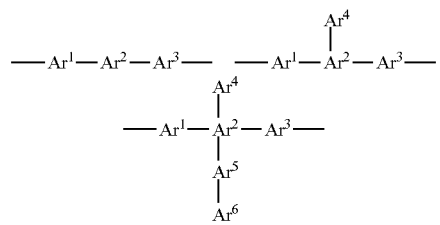

where Ar¹ to Ar⁶ each represent an unsubstituted aromatic hydrocarbon ring or aromatic heterocycle.

In each of L¹, L², and R, the aromatic hydrocarbon group, the aromatic heterocyclic group, or the linked aromatic group may have a substituent. When any such aromatic group has a substituent, the substituent is desirably an alkyl group having 1 to 12 carbon atoms, an alkoxy group having 1 to 12 carbon atoms, or an acyl group having 2 to 13 carbon atoms, and any such group may be linear, branched, or cyclic. The substituent is preferably an alkyl group having 1 to 10 carbon atoms, an alkoxy group having 1 to 10 carbon atoms, or an acyl group having 2 to 11 carbon atoms, more preferably an alkyl group having 1 to 4 carbon atoms, an alkoxy group having 1 or 2 carbon atoms, or an acetyl group. In this description, the number of carbon atoms of the aromatic hydrocarbon group, the aromatic heterocyclic group, or the linked aromatic group does not include the number of carbon atoms of a substituent. However, the total number of carbon atoms including the number of carbon atoms of the substituent preferably satisfies the above-mentioned number of carbon atoms.

Here, the alkyl group means an aliphatic hydrocarbon group, and includes cyclic hydrocarbon groups produced from cycloterpenes and the like in addition to chain hydrocarbon groups. Specific examples of the alkyl group include chain or branched alkyl groups, such as a methyl group, an ethyl group, a propyl group, an isopropyl group, a butyl group, a pentyl group, a hexyl group, and an octyl group, and cyclic alkyl groups including cycloalkyl groups, such as a cyclopentyl group and a cyclohexyl group.

Specific examples of the alkoxy group include alkoxy groups such as a methoxy group, an ethoxy group, and a propoxy group derived from the alkyl groups, such as the methyl group, the ethyl group, and the propyl group, respectively.

Specific examples of the acyl group include acyl groups such as an acetyl group and an ethylcarbonyl group.

In addition, when $L^1$-H or $L^2$-H at the terminal represents an alkyl group having 1 to 12 carbon atoms or an alkoxy group having 1 to 12 carbon atoms, the group may be linear, branched, or cyclic as in the alkyl group or the alkoxy group described in the substituent.

In the general formula (1), s represents a number of repetitions and represents an integer of from 1 to 4, and m and n each represent a substitution number, and m represents an integer of from 0 to 4, and n represents an integer of from 0 to 3, provided that when m=1, s=1. It is preferred that: m represent an integer of 0 or from 1 to 3, more preferably an integer of 1 or 2, still more preferably 1; s represent an integer of 1 or 2; and n represent an integer of from 0 to 2.

In the general formula (1), X's each represent N, CH, or C, and at least two of six X's each represent N. The aromatic ring formed of X's preferably contains two or three N's. When any one of X's represents C, C has a bonding hand to be bonded to R or the ring A. The aromatic ring formed of X's is preferably a 1,3,5-triazine ring, a pyrimidine ring, a pyrazine ring, or a pyridazine ring.

The carborane compound represented by the general formula (1) can be synthesized by using a known approach after the selection of a raw material in accordance with the structure of a target compound.

A compound [A-1] can be synthesized by the following reaction formula with reference to a synthesis example disclosed in Journal of Organometallic Chemistry, 1993, 462, p 19-29. The carborane compound represented by the general formula (1) can be obtained by applying or modifying the reaction formula.

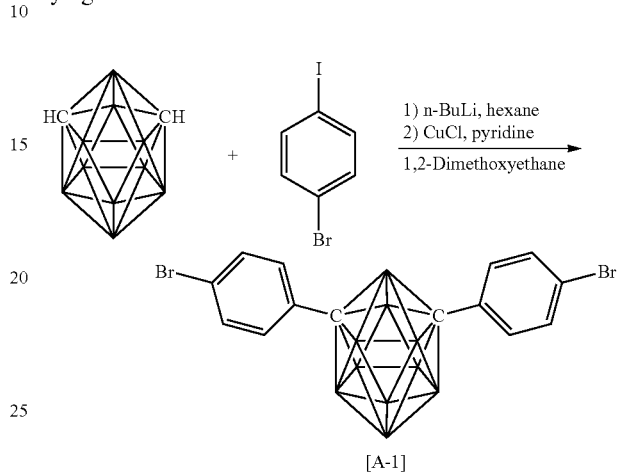

[A-1]

Specific examples of the carborane compound represented by the general formula (1) are shown below. However, the material for an organic electroluminescent device of the present invention is not limited thereto.

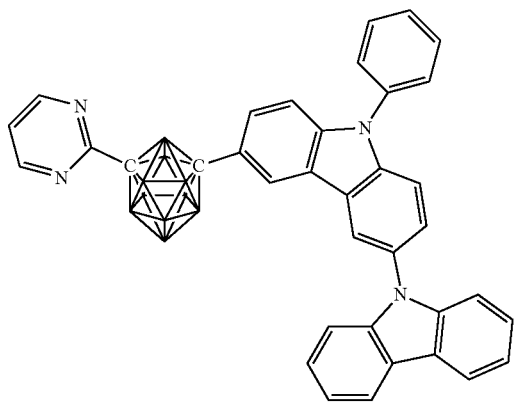

1

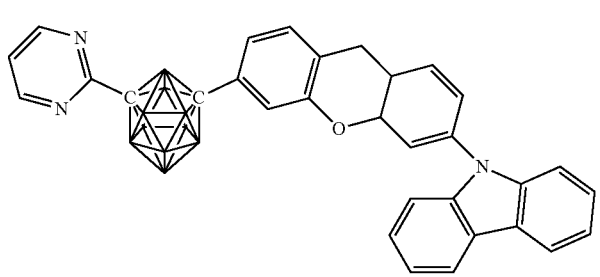

2

-continued
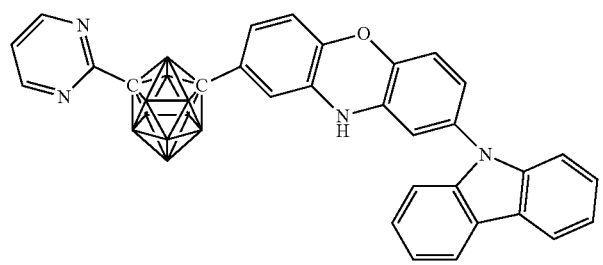
3
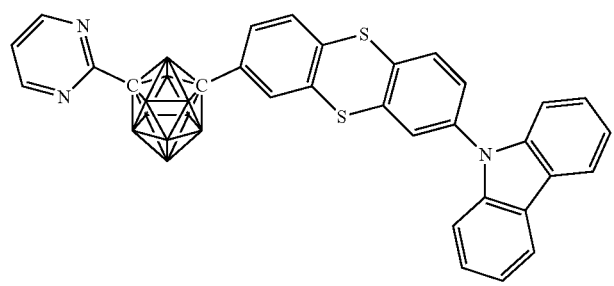
4
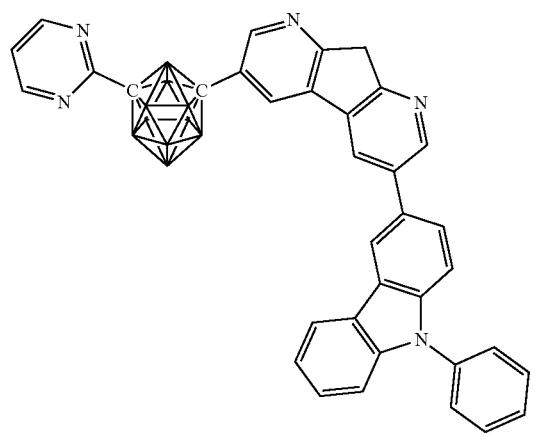
5
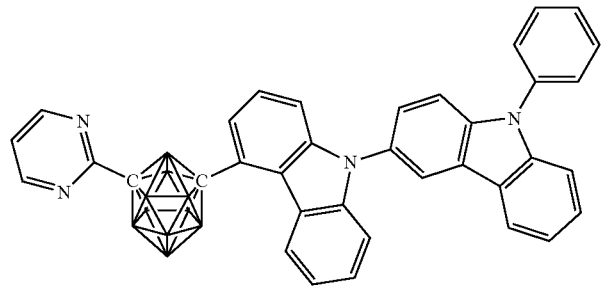
6

7
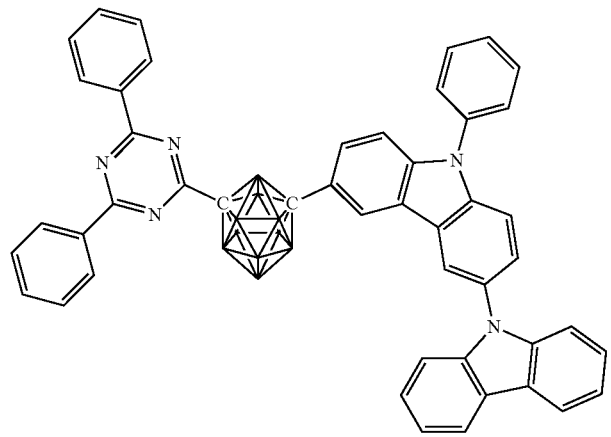
8
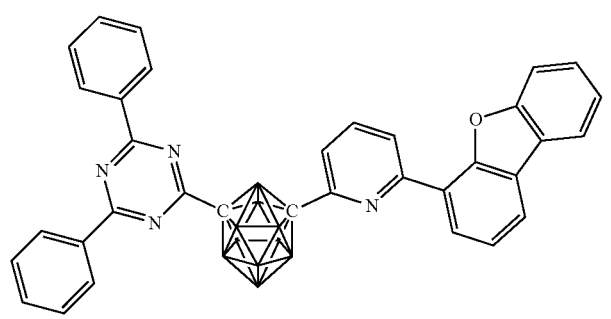
9
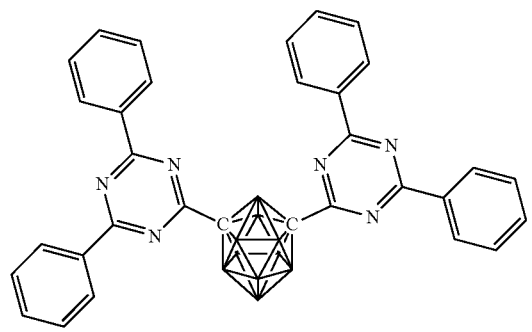
10
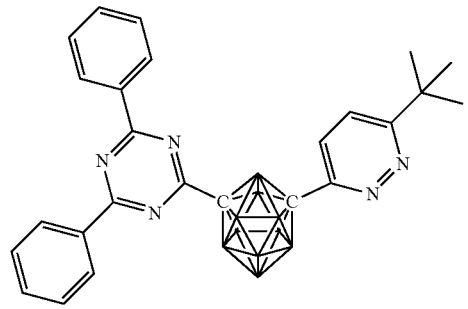

-continued
11
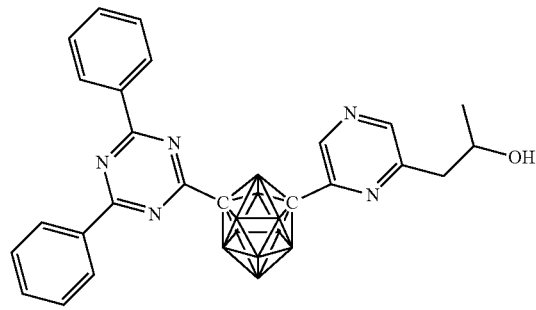
12
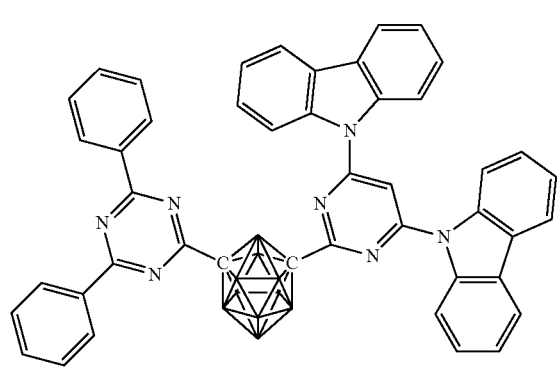
13
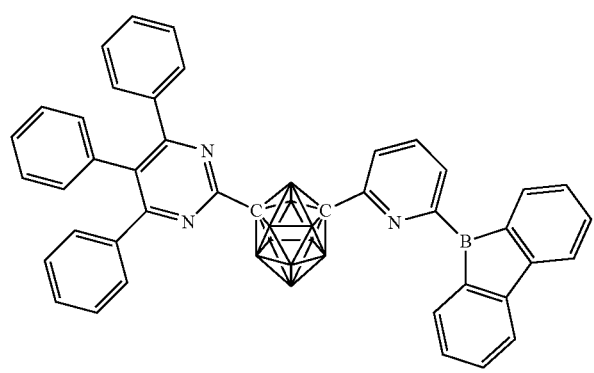
14
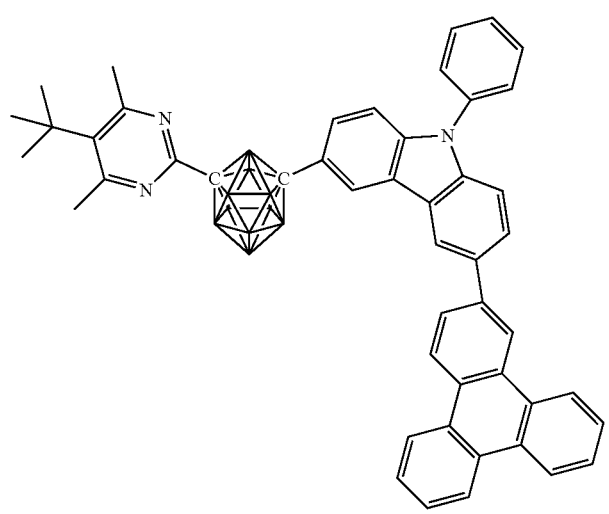

-continued
15
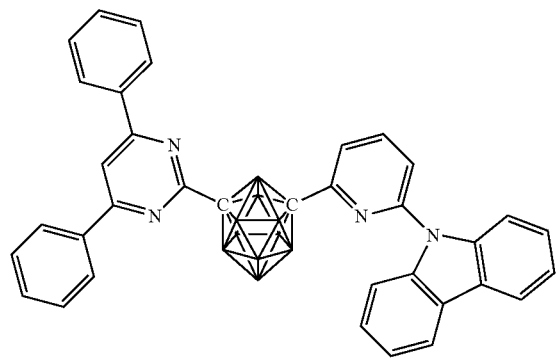
16
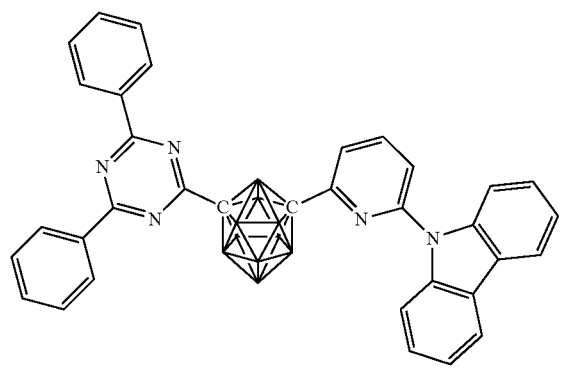
17
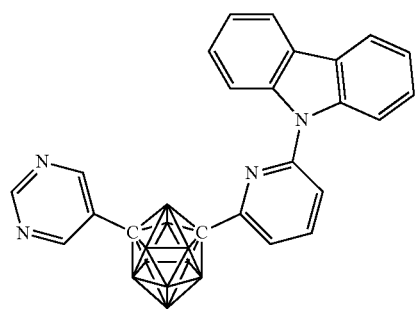
18
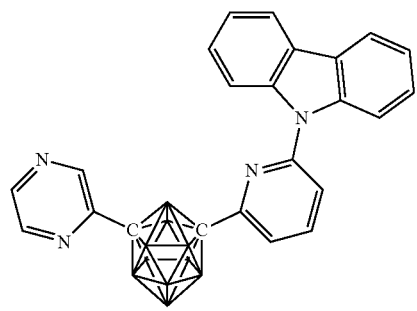

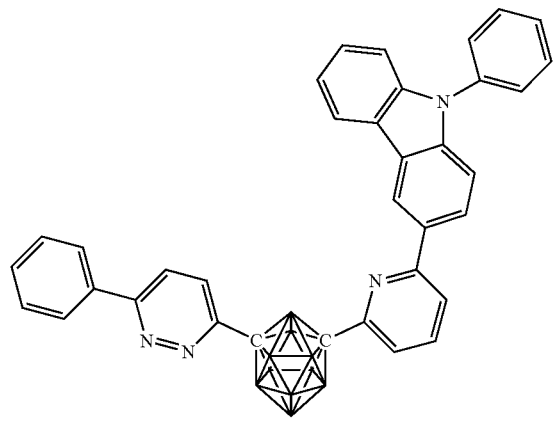
19
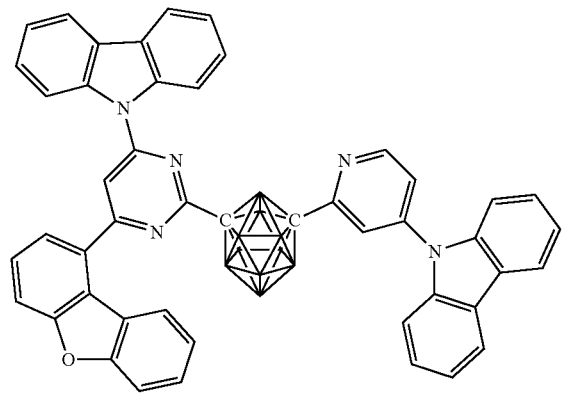
20
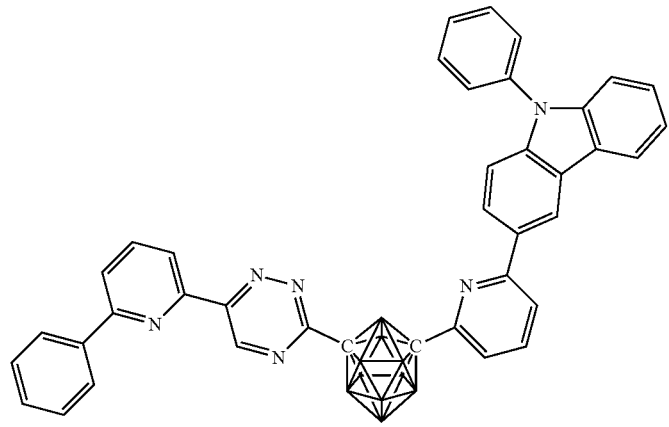
21

-continued
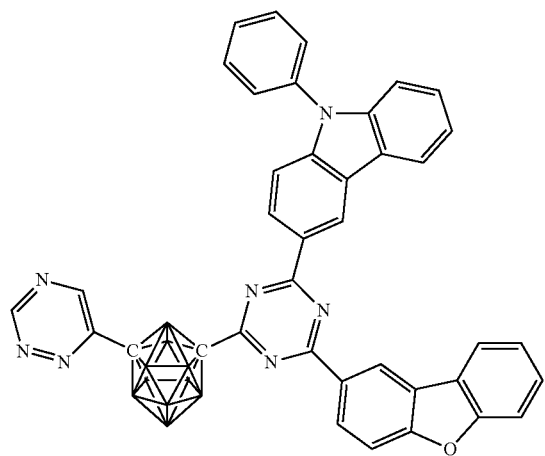
22
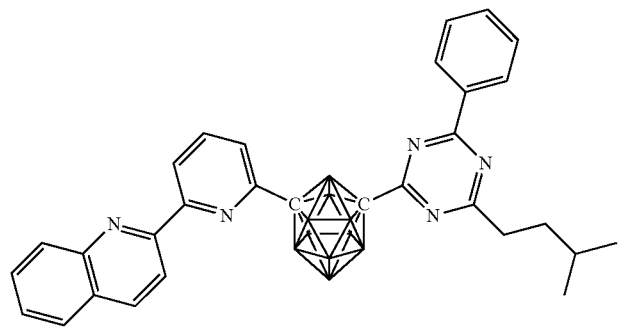
23
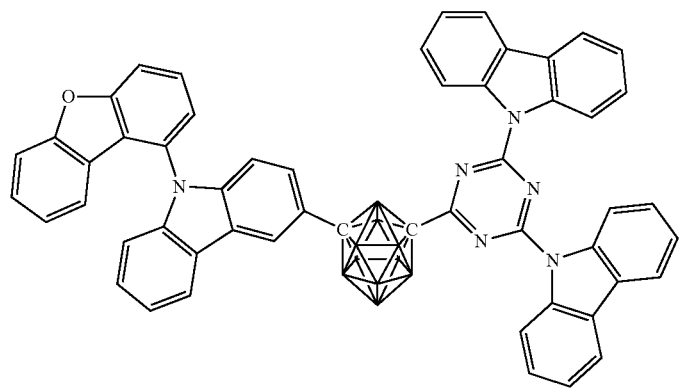
24
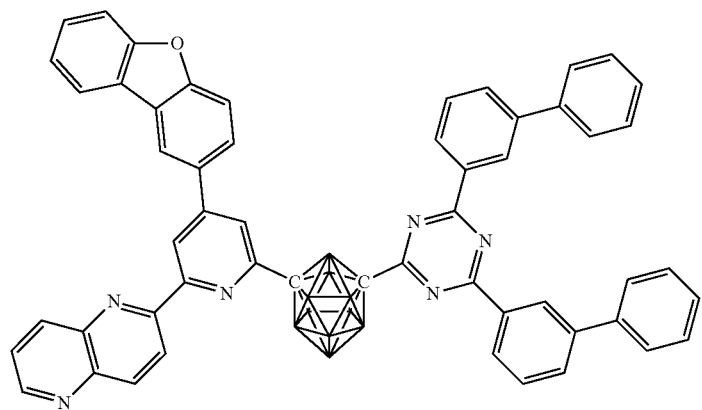
25

26
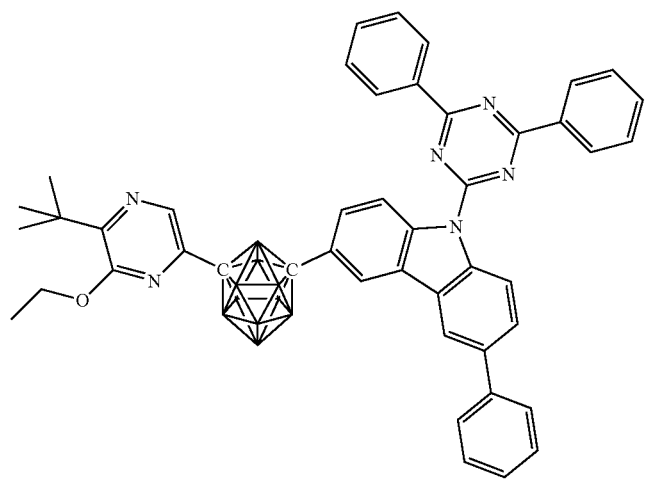
27
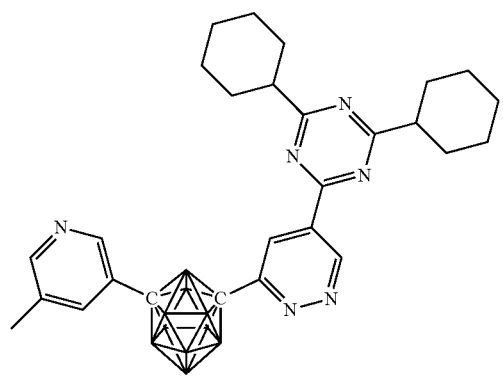
28
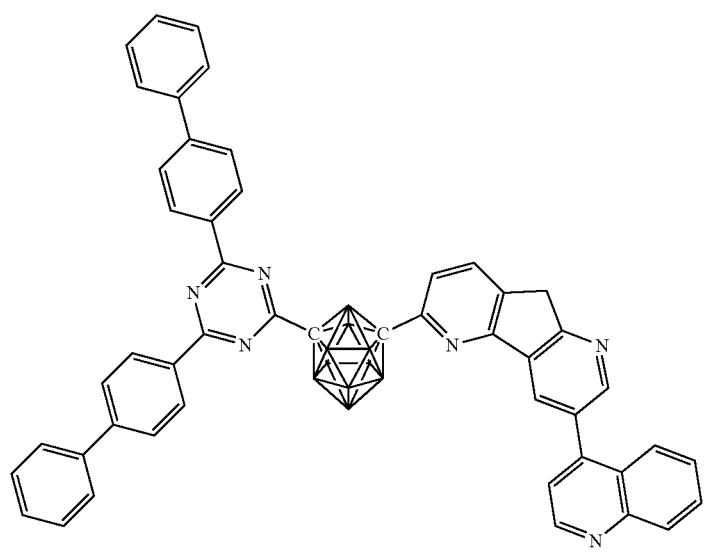

-continued
29
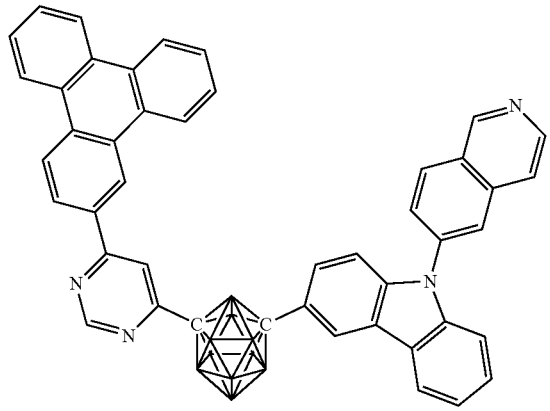
30
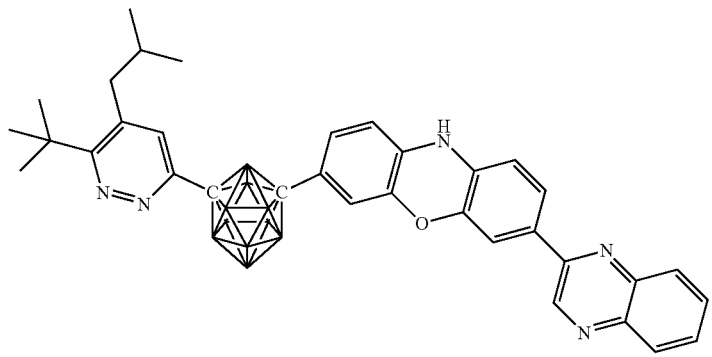
31
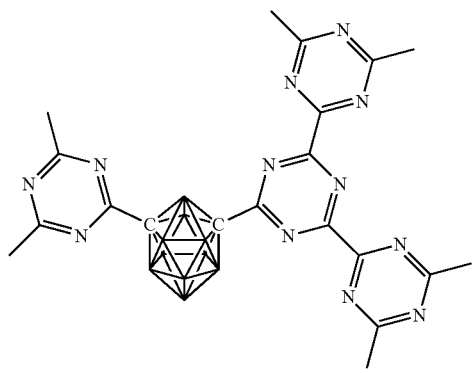
32
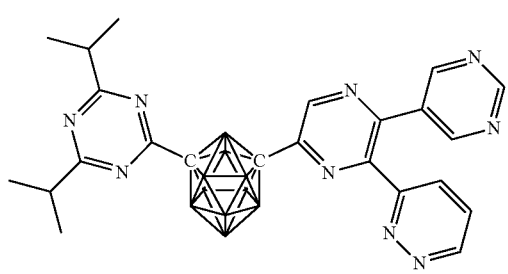
33
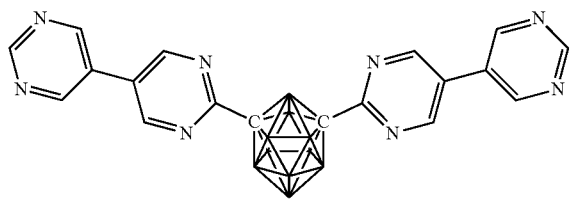

-continued
34
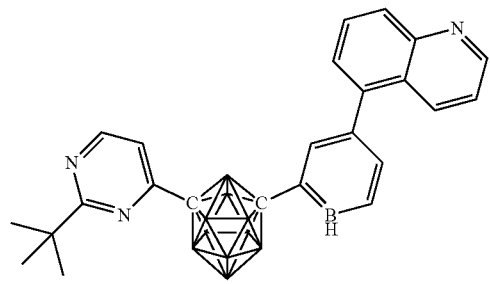
35
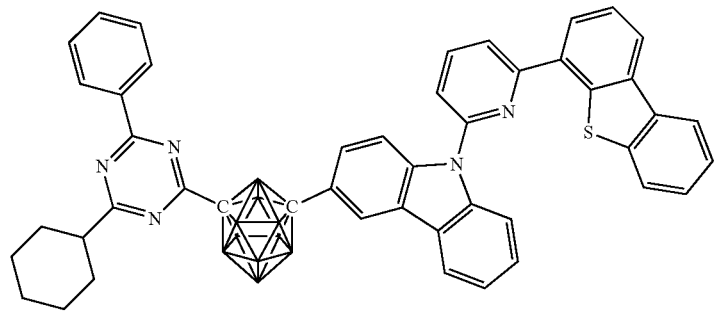
36
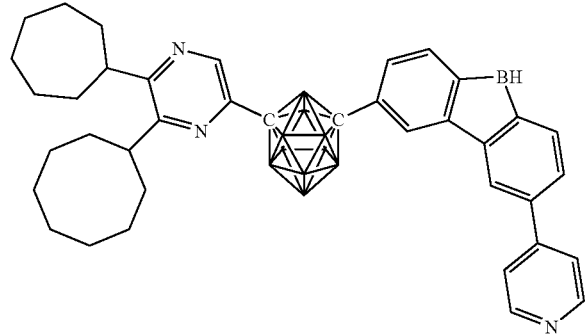
37
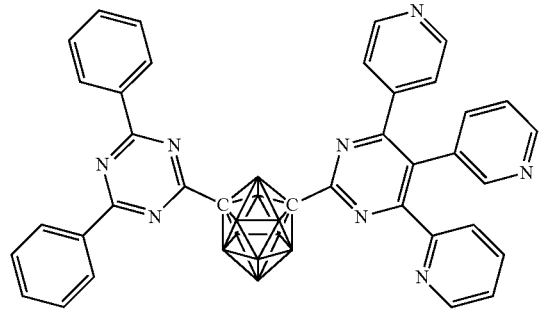
38
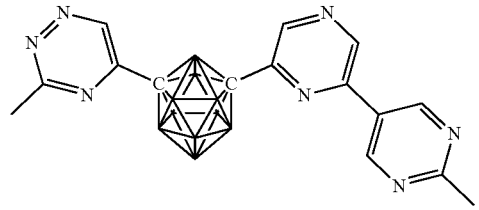

-continued
39
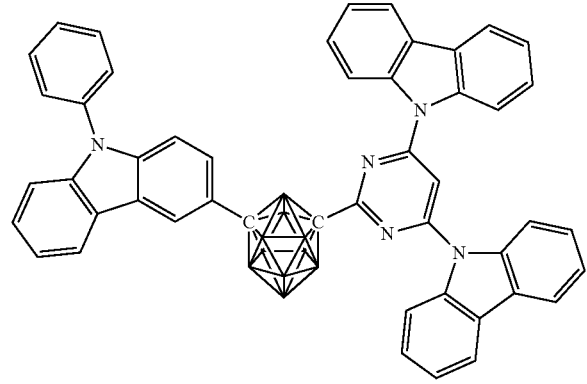
40
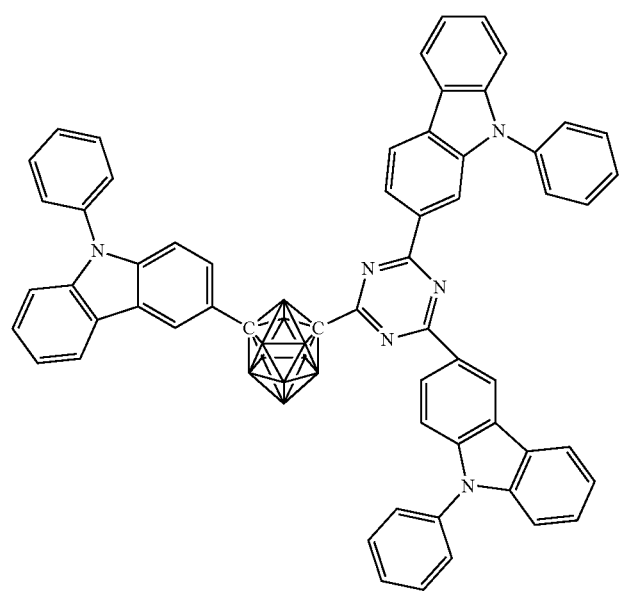
41
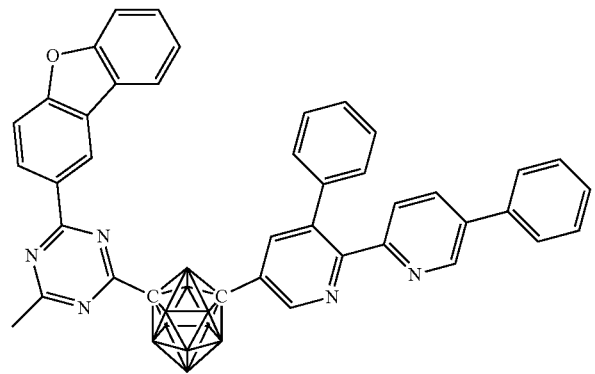

42
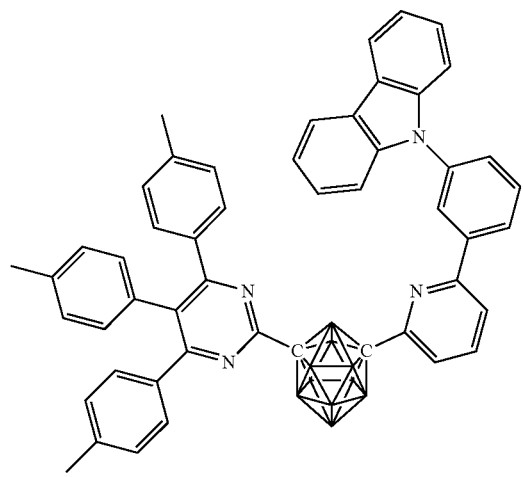
43
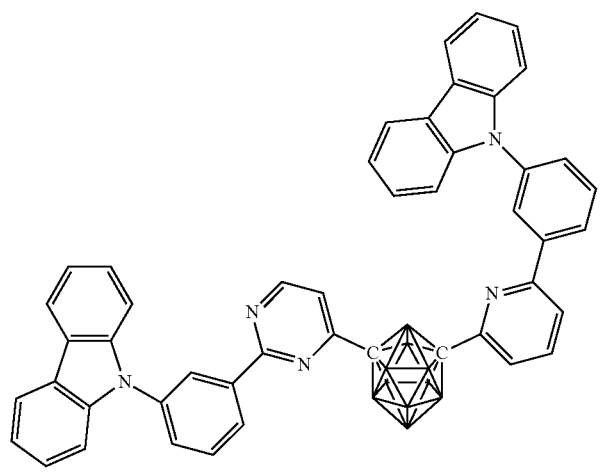
44
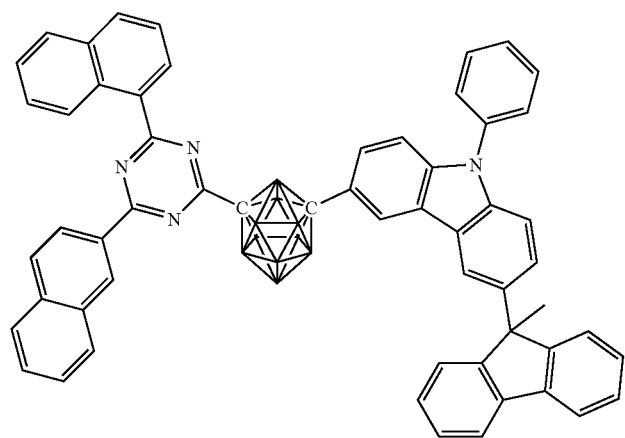

-continued
45
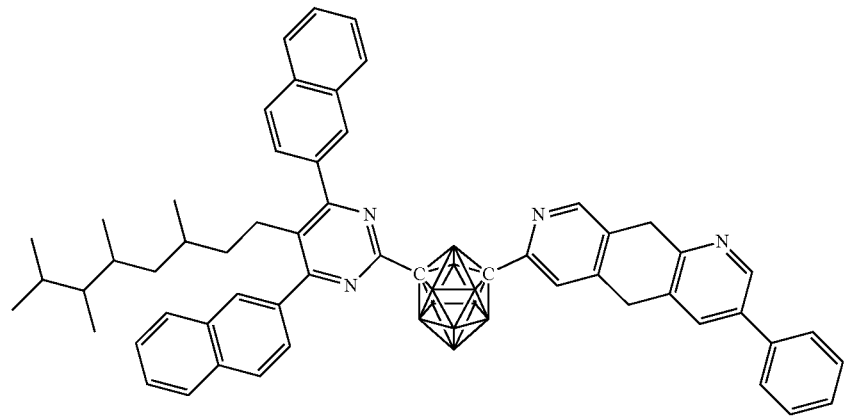
46
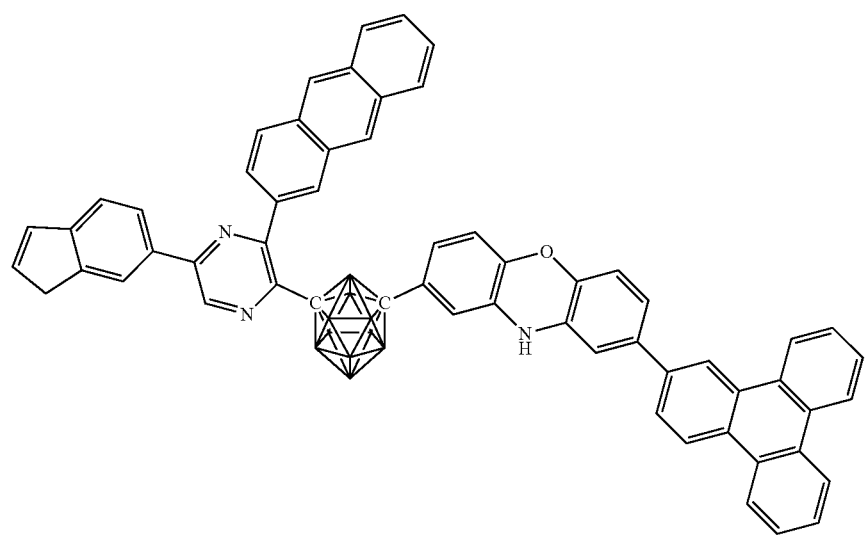
47
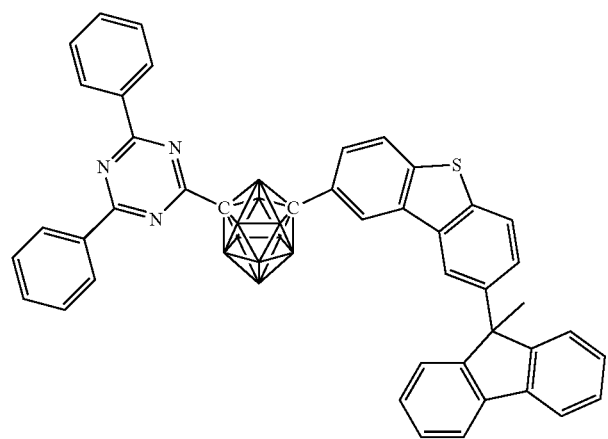

48
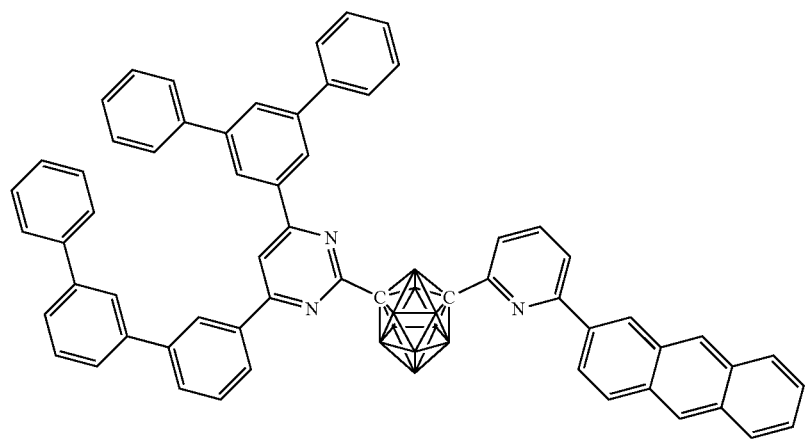
49
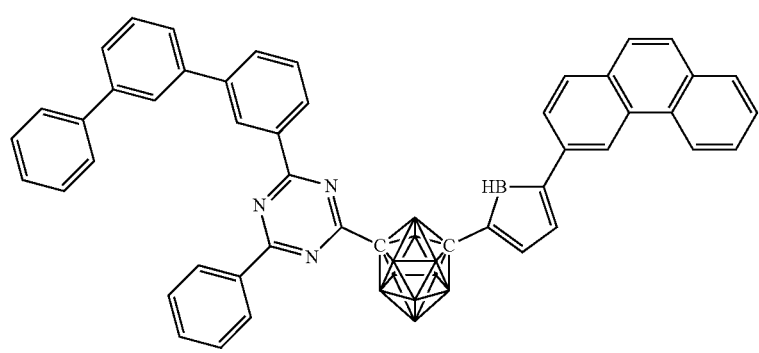
50
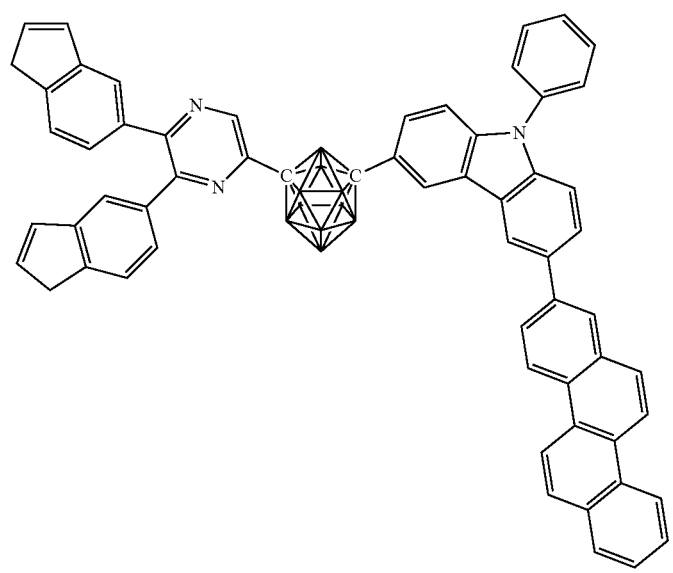

-continued
51
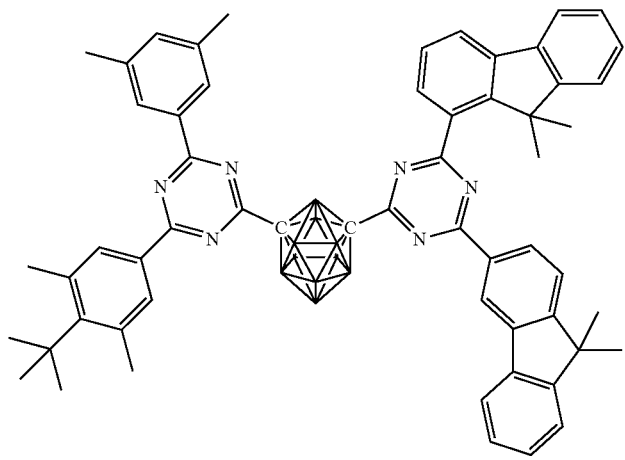
52
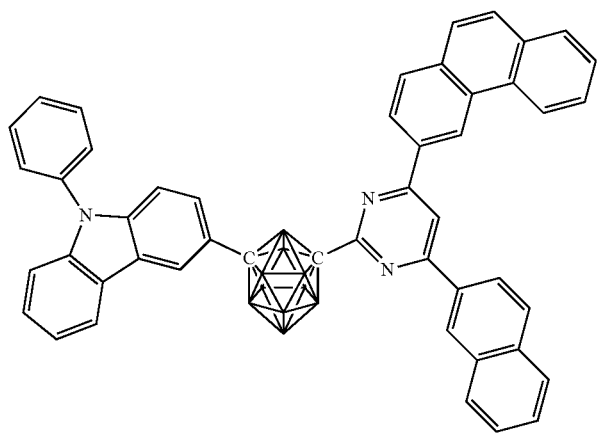
53
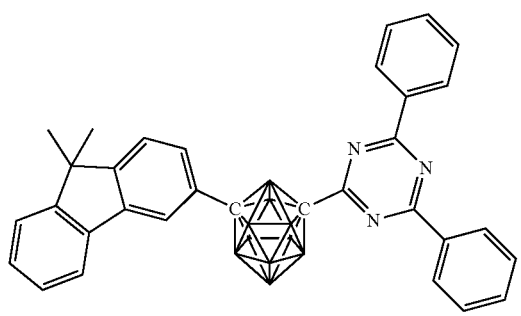
54
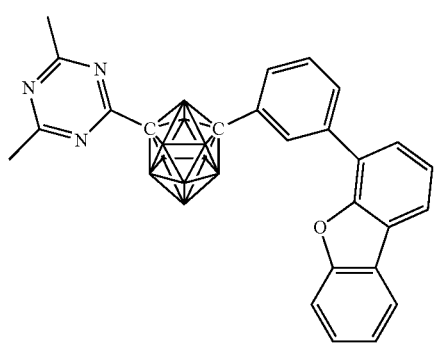

55
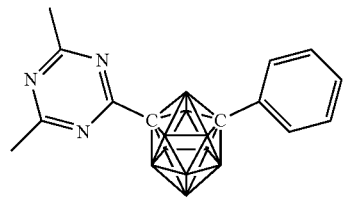
56
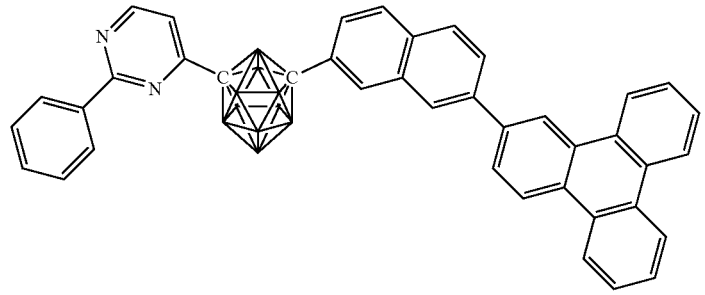
57
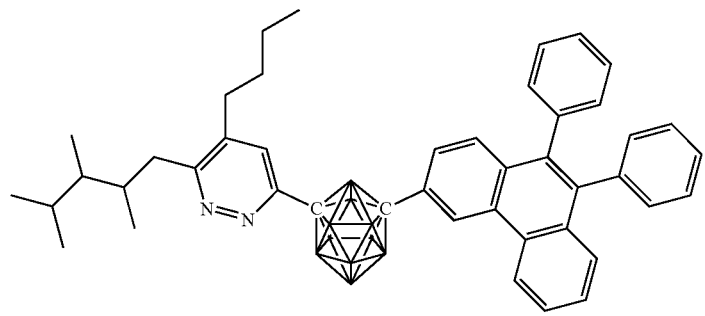
58
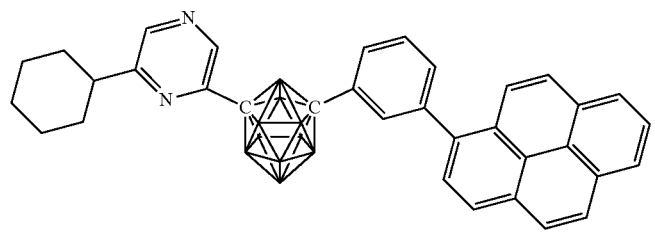
59
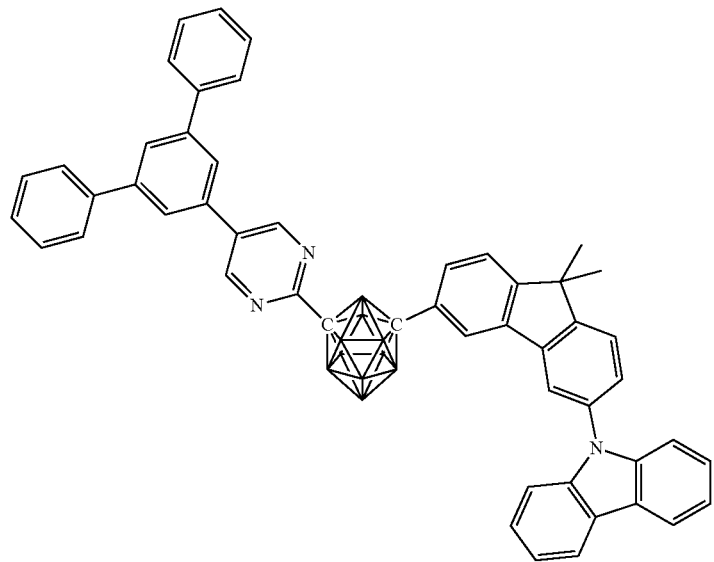

-continued
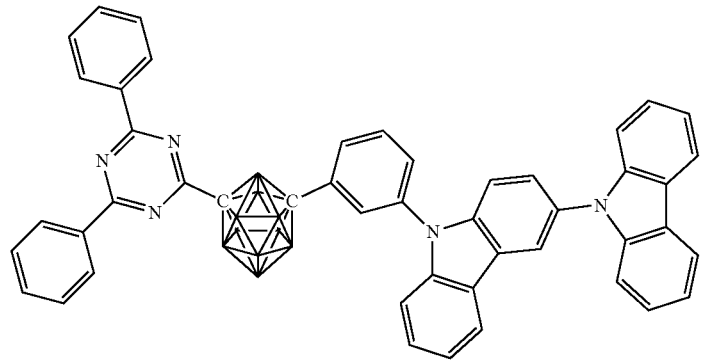
60
61
62

-continued
63
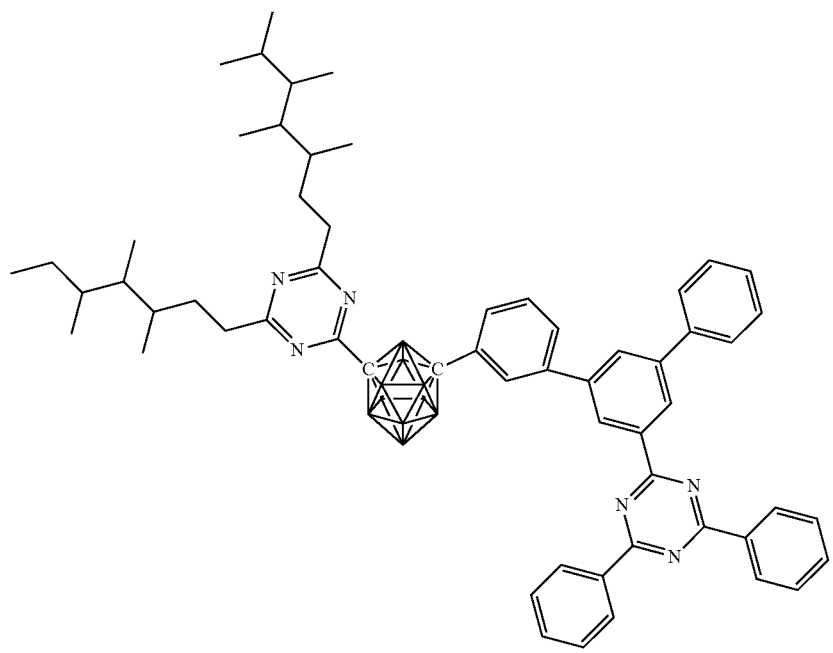
64
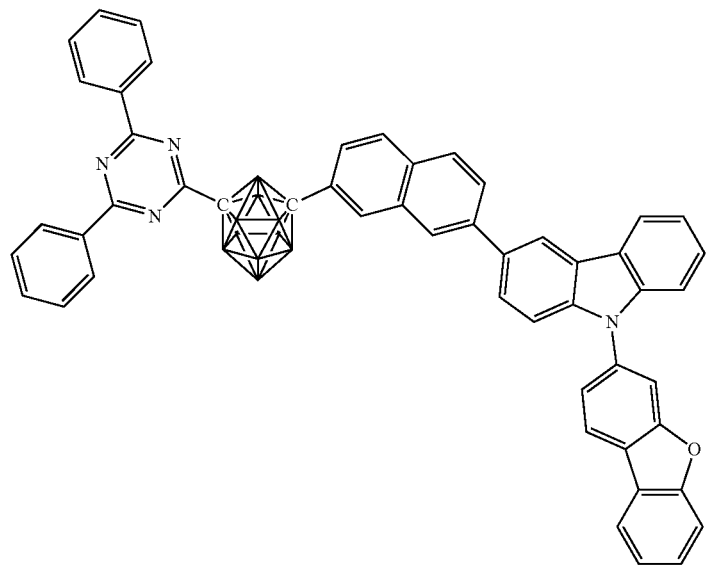
65
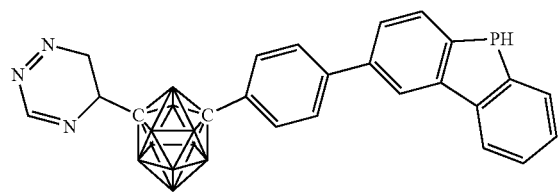

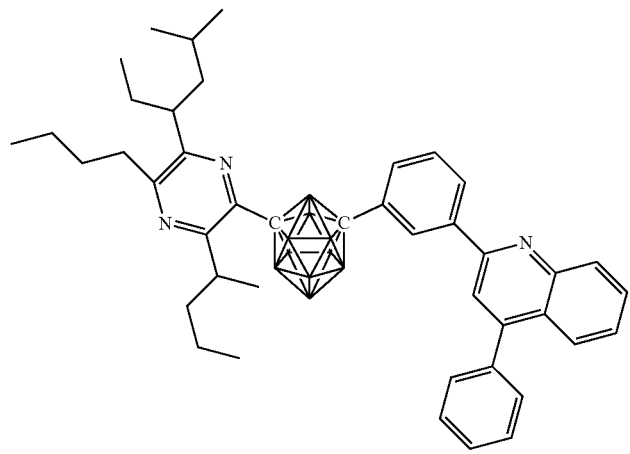
66
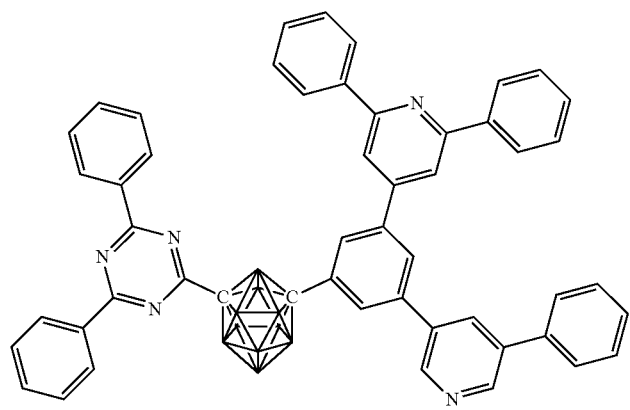
67
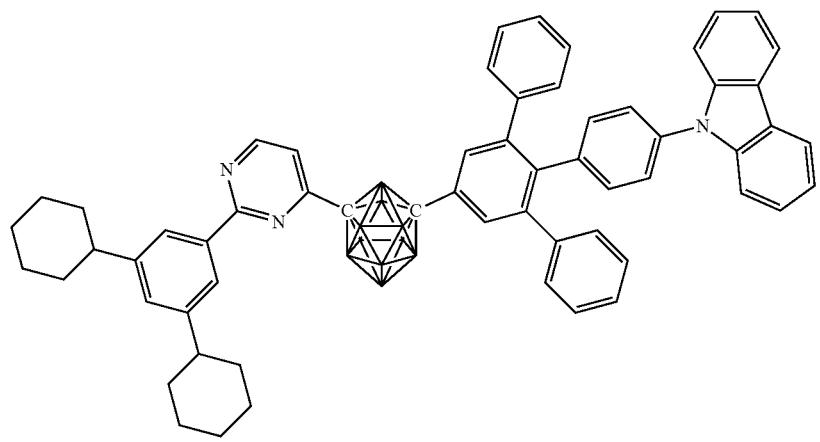
68

-continued
69
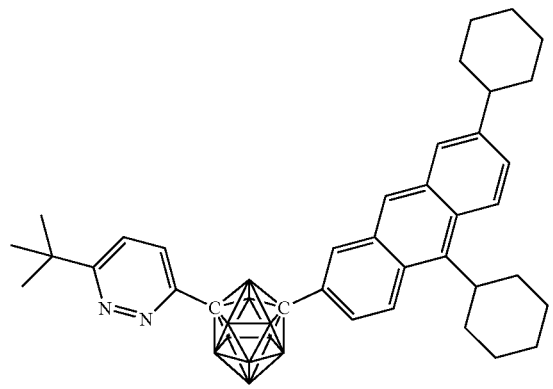
70
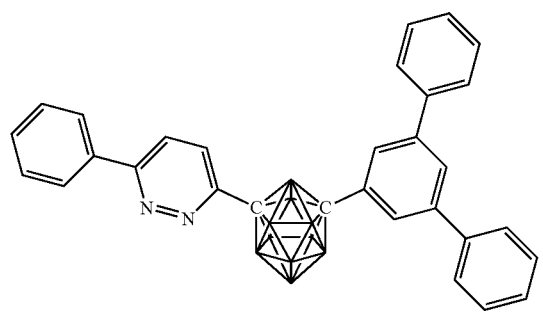
71
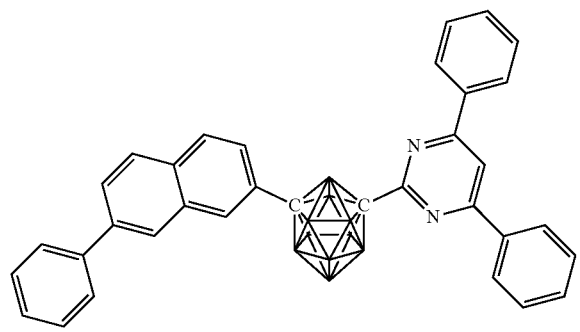
72
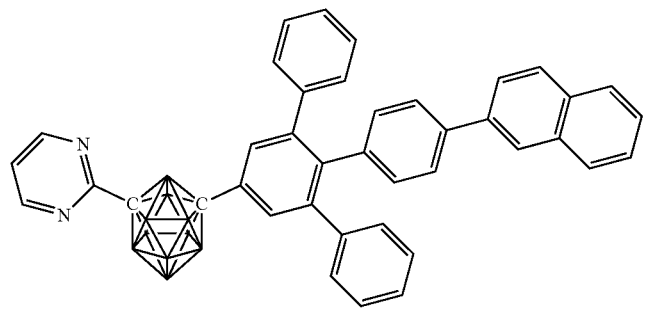

73
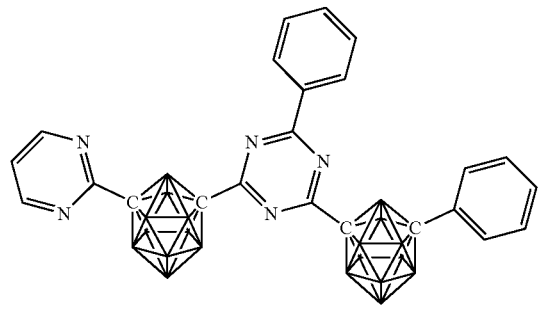
74
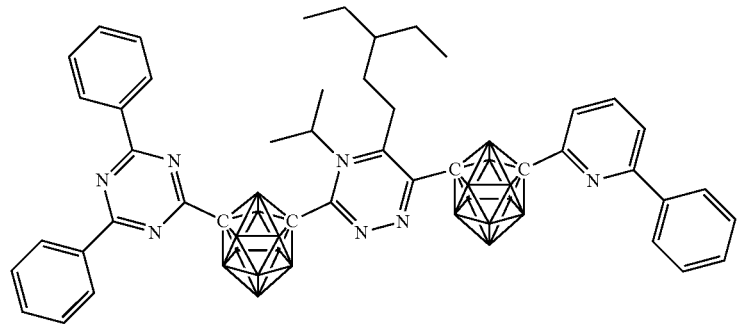
75
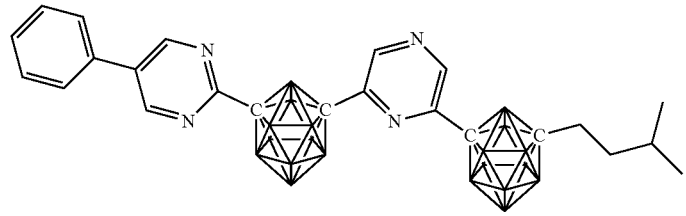
76
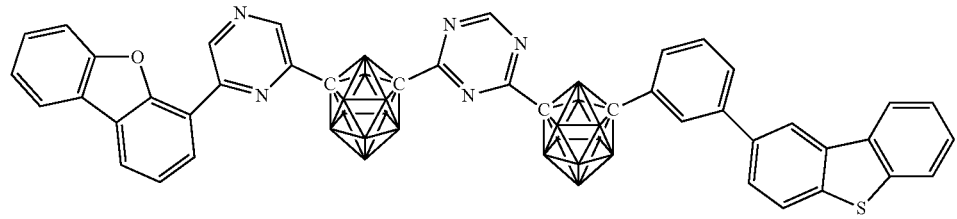
77
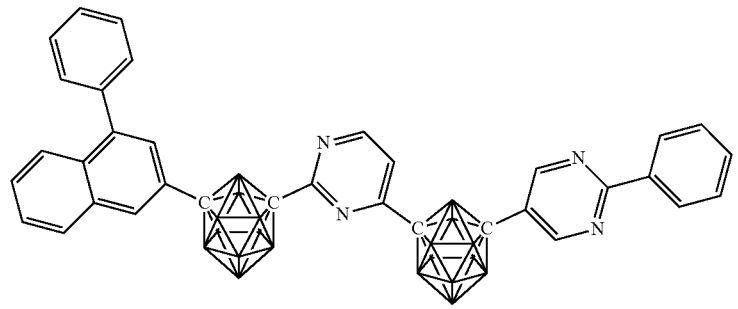
78
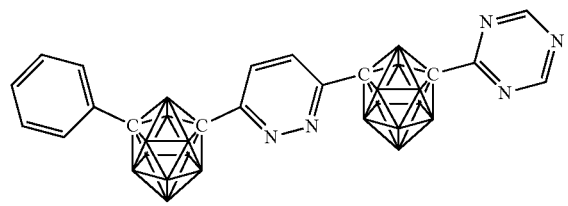

-continued
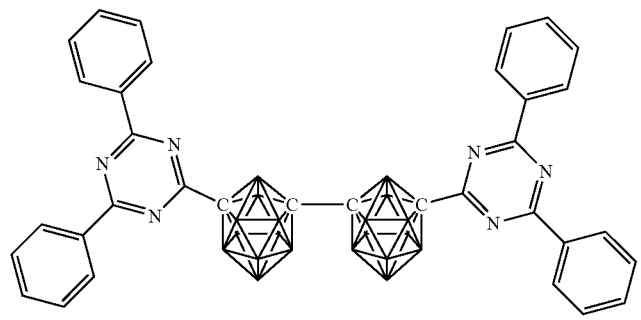
79
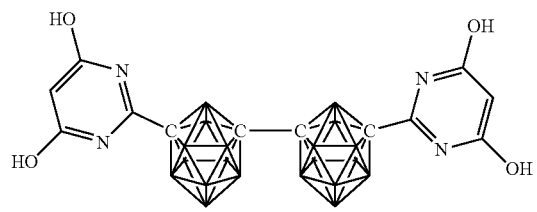
80
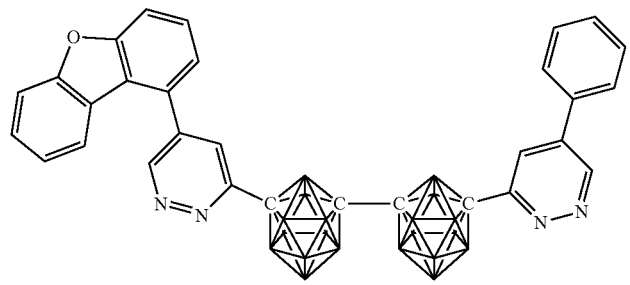
81
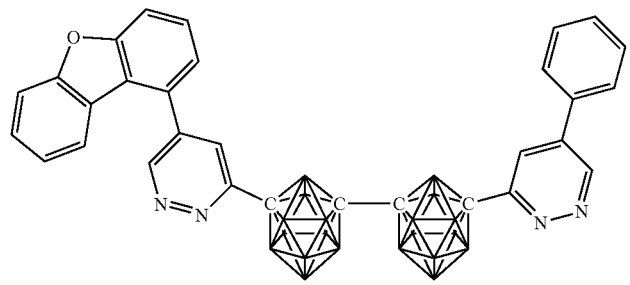
82
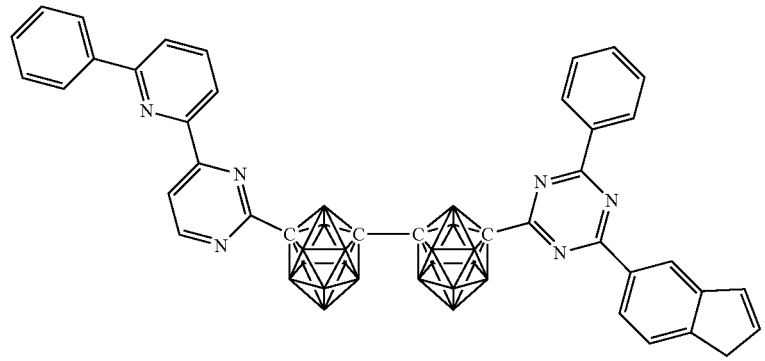
83

-continued
84
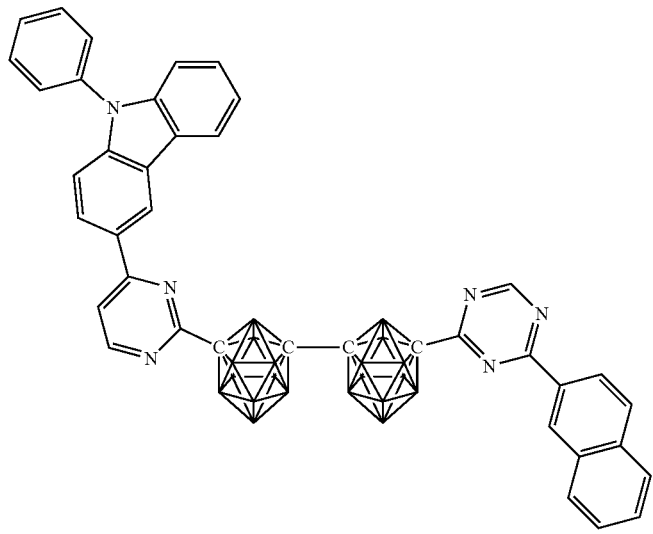
85
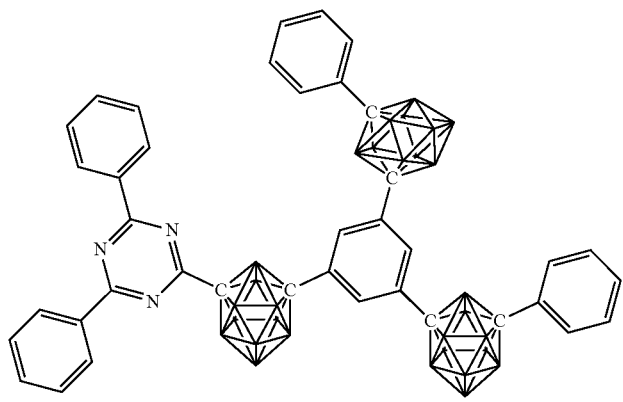
86
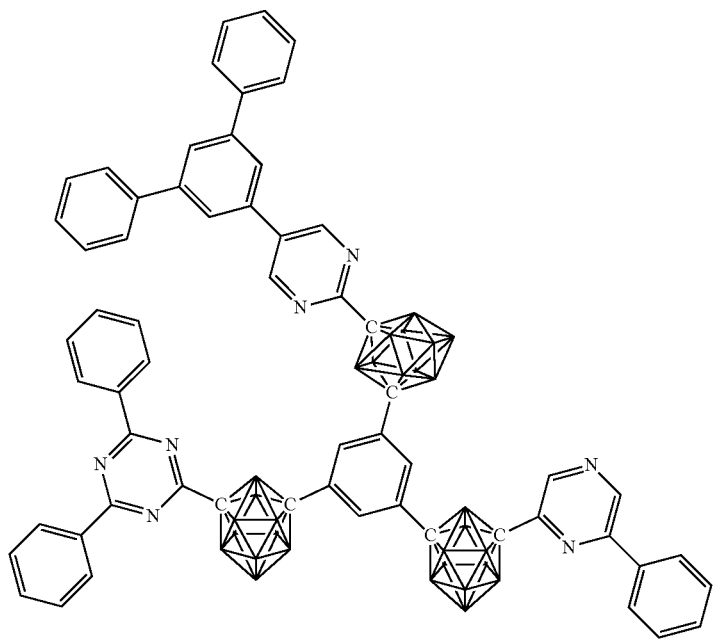

87
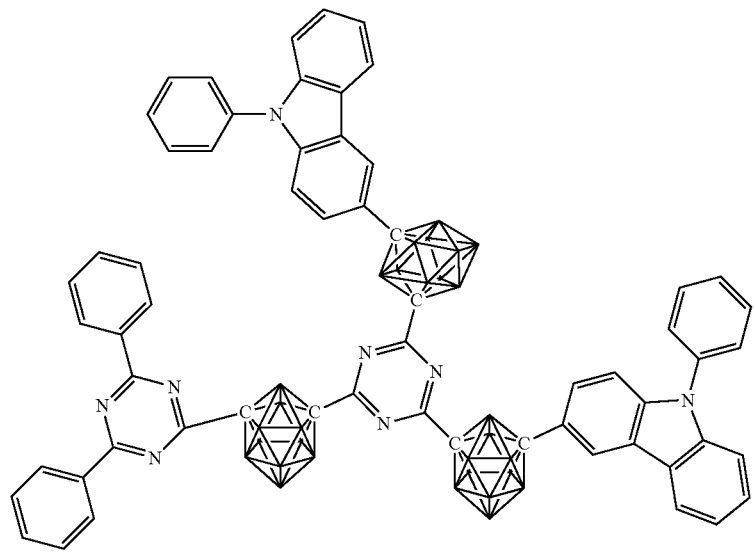
88
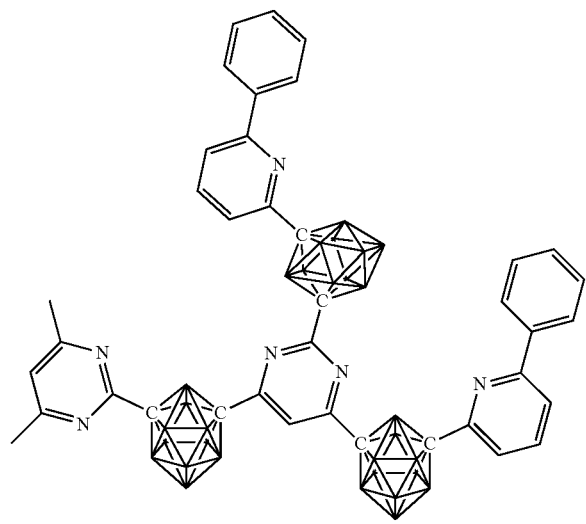
89
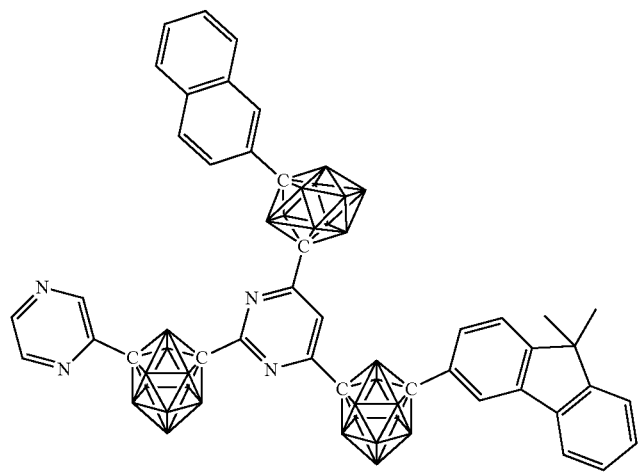

-continued
90
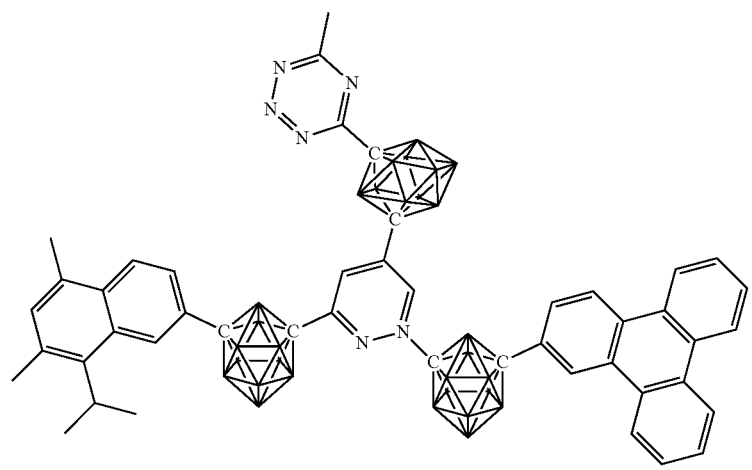
91
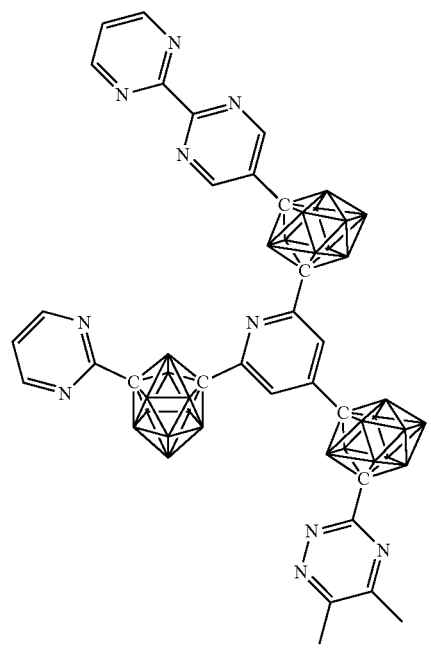
92
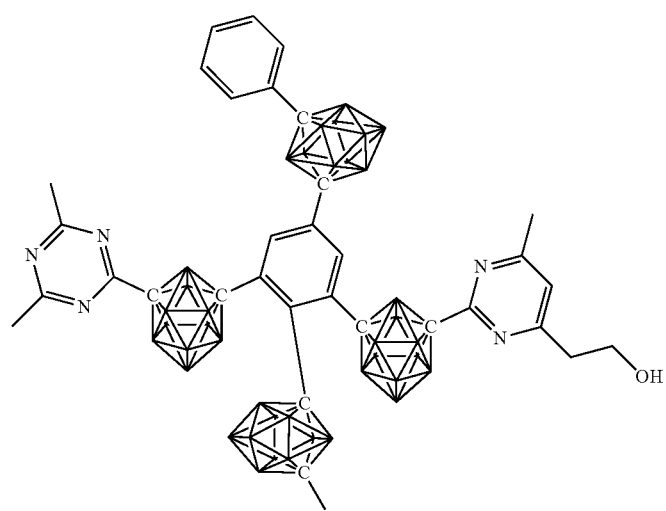

93
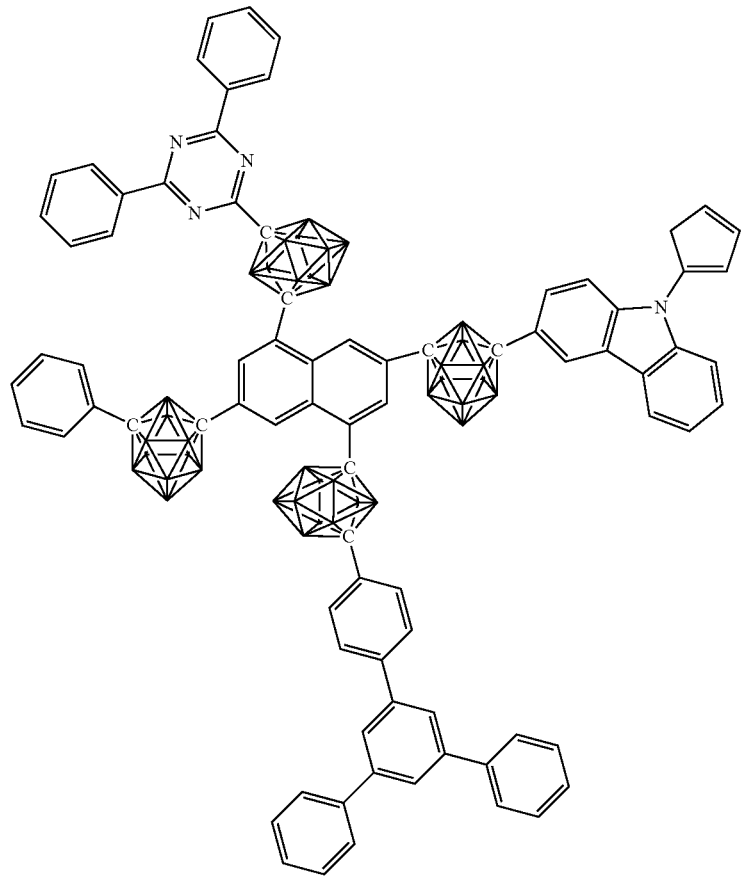
94
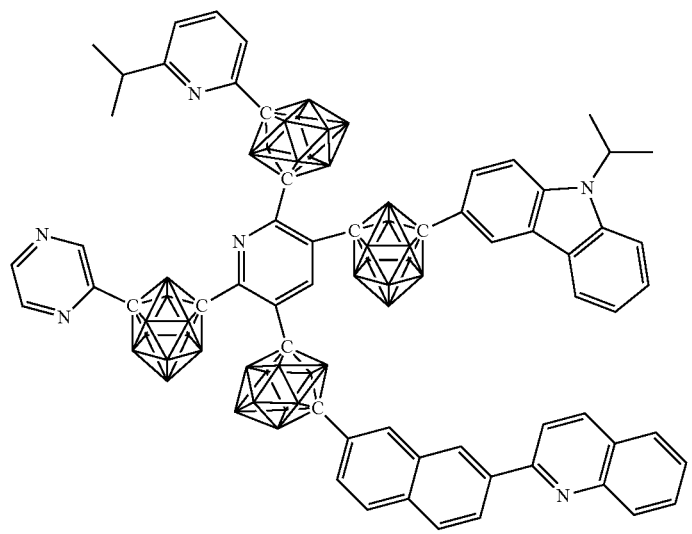

95
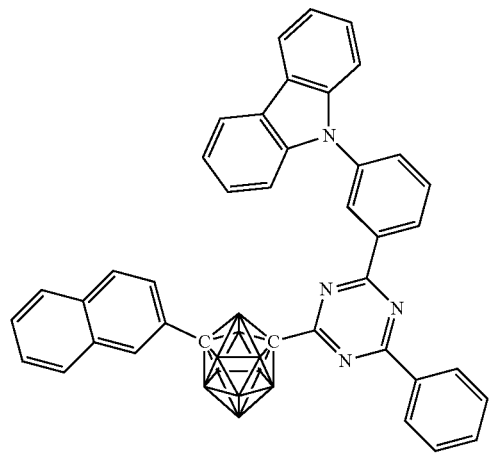
96
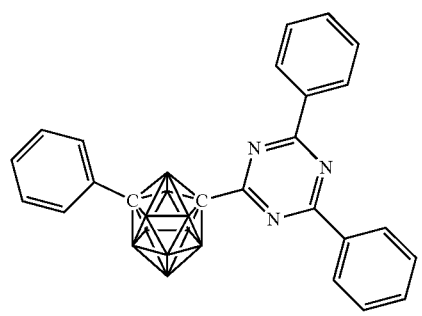
97
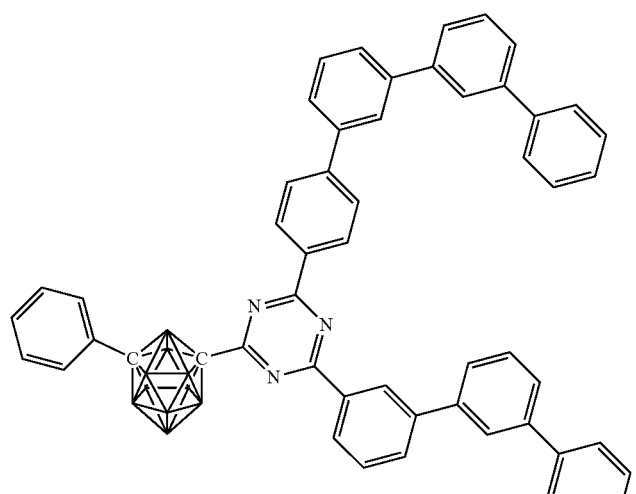
98
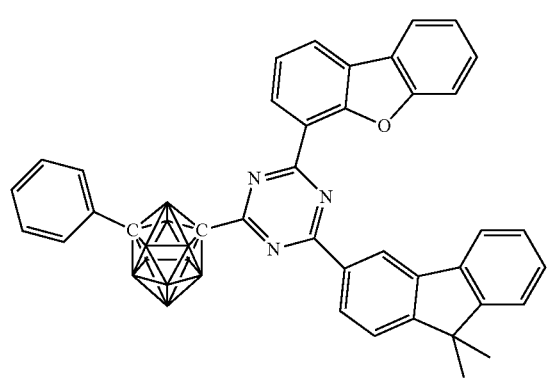

-continued
99
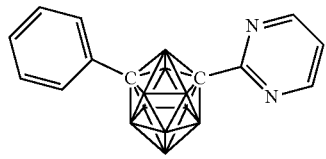
100
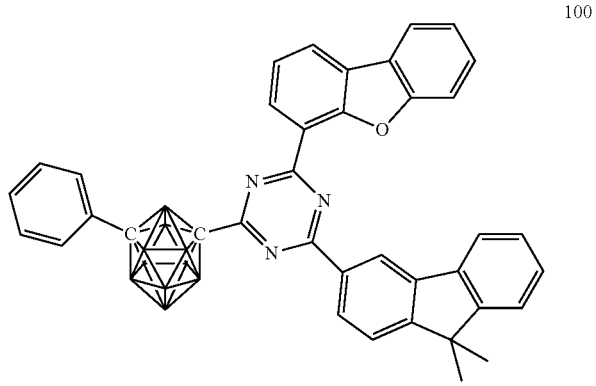
101
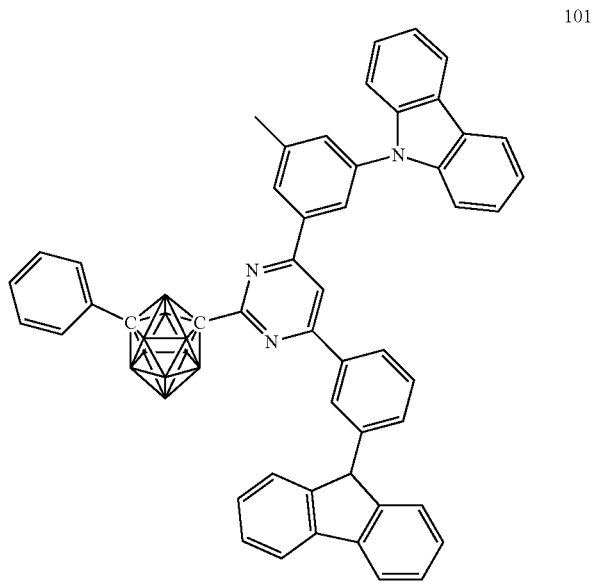
102
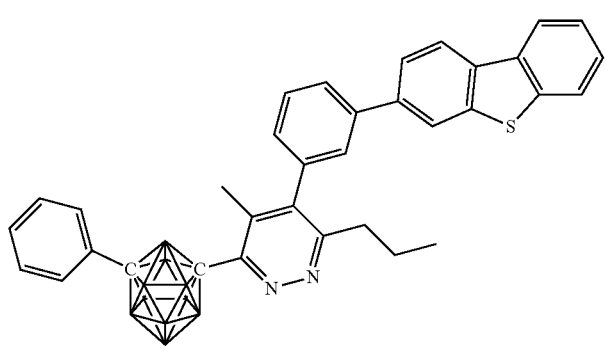

103
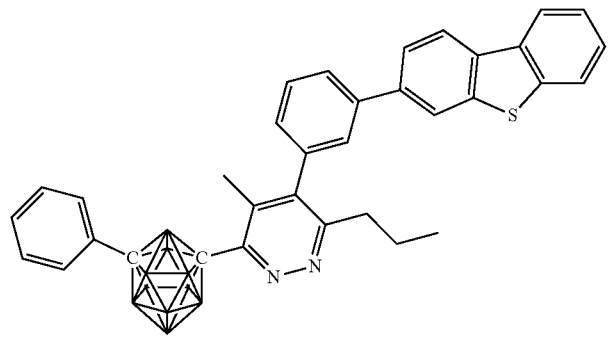
104
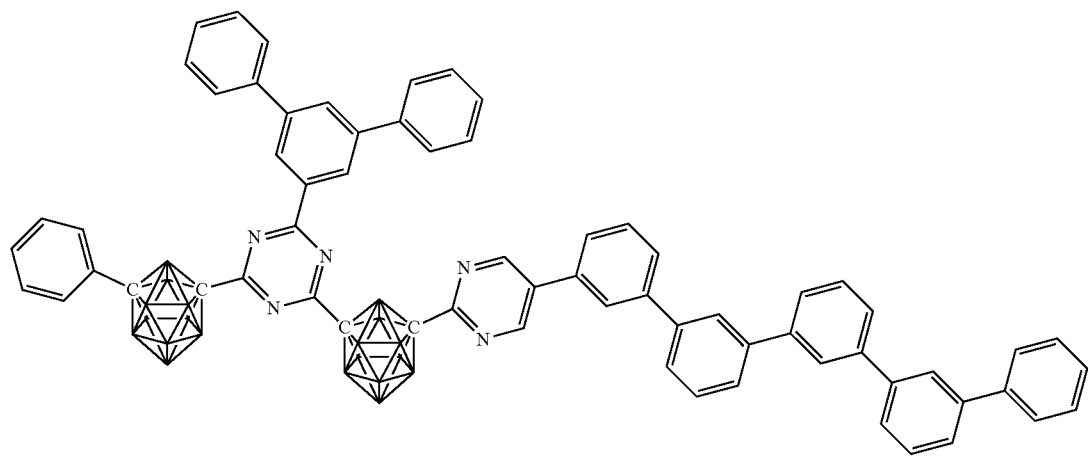
105
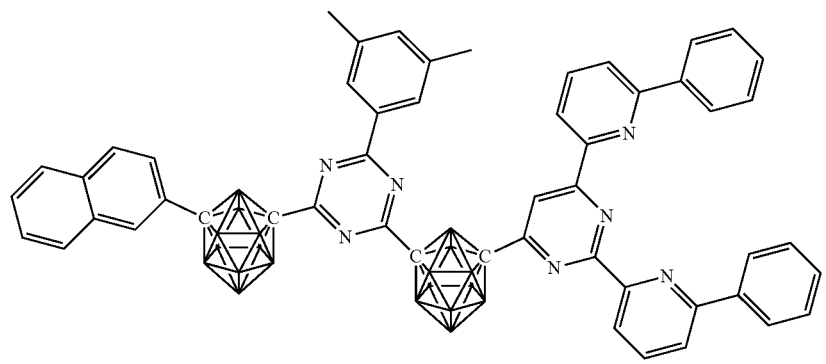
106
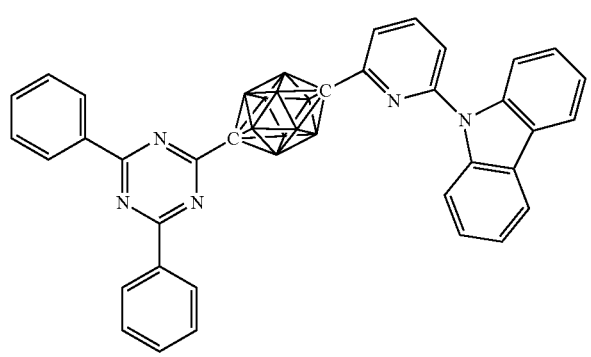

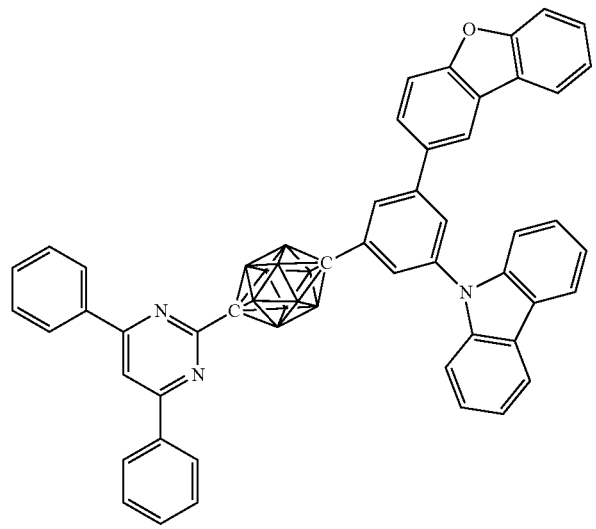
107
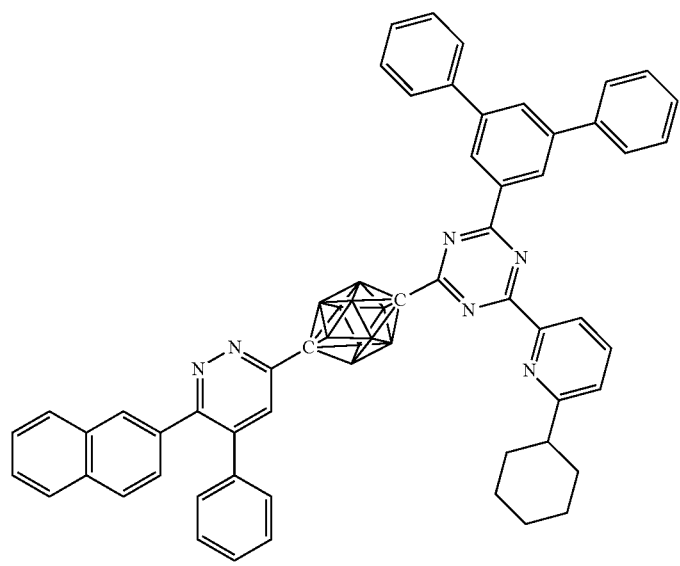
108
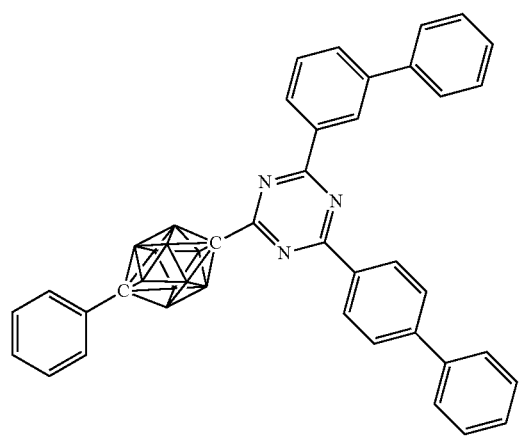
109

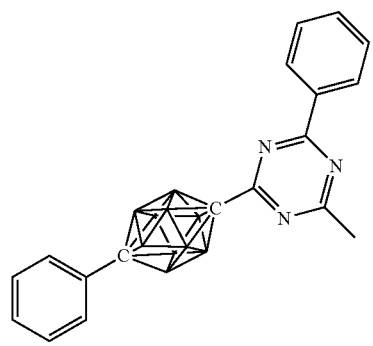
110
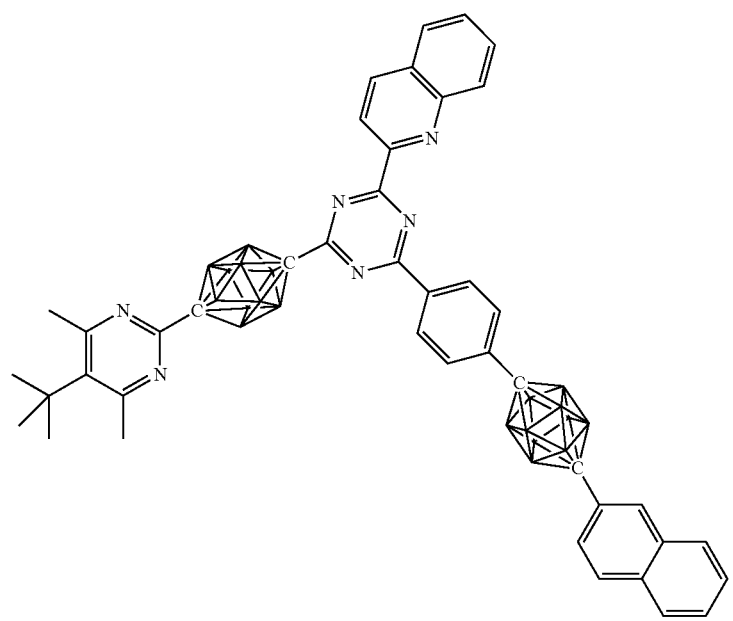
111
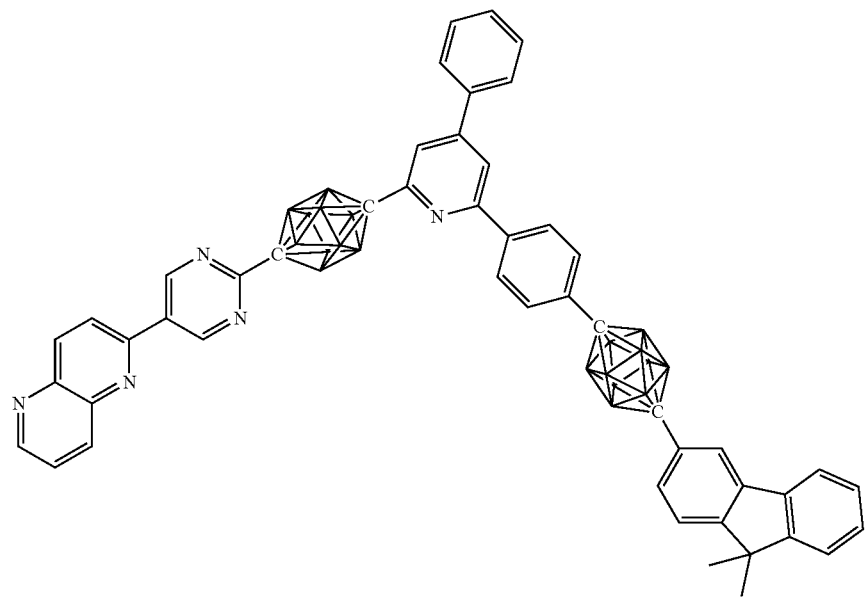
112

-continued

113

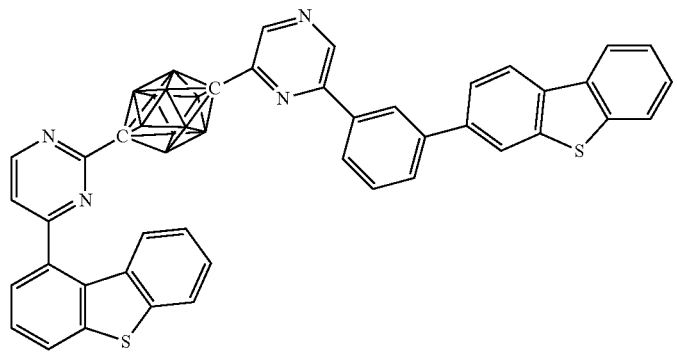

114

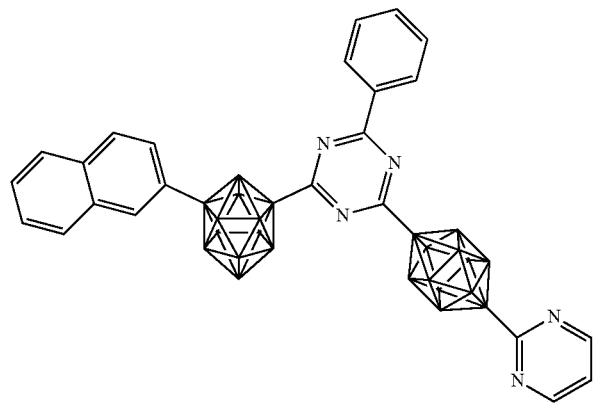

The material for an organic electroluminescent device of the present invention is formed of the carborane compound represented by the general formula (1) (sometimes referred to as "the carborane compound of the present invention" or "the material of the present invention"). When the carborane compound of the present invention is contained in at least one of a plurality of organic layers of an organic EL device having a structure in which an anode, the plurality of organic layers, and a cathode are laminated on a substrate, an excellent organic electroluminescent device is provided. A light-emitting layer, an electron-transporting layer, or a hole-blocking layer is suitable as the organic layer in which the material is contained. Here, when the carborane compound of the present invention is used in the light-emitting layer, the compound may be used as a host material for the light-emitting layer containing a fluorescent light-emitting, delayed fluorescent light-emitting, or phosphorescent light-emitting dopant. In addition, the compound of the present invention may be used as an organic light-emitting material that radiates fluorescence and delayed fluorescence. When the compound of the present invention is used as an organic light-emitting material that radiates fluorescence and delayed fluorescence, any other organic compound having a value for at least one of excited singlet energy or excited triplet energy higher than that of the compound of the present invention is preferably used as the host material. The carborane compound of the present invention is particularly preferably incorporated as a host material for the light-emitting layer containing the phosphorescent light-emitting dopant.

Next, an organic EL device using the material for an organic electroluminescent device of the present invention is described.

The organic EL device of the present invention includes organic layers including at least one light-emitting layer between an anode and a cathode laminated on a substrate. In addition, at least one of the organic layers contains the material for an organic electroluminescent device of the present invention. The material for an organic electroluminescent device of the present invention is advantageously contained in the light-emitting layer together with a phosphorescent light-emitting dopant.

Next, the structure of the organic EL device of the present invention is described with reference to the drawings. However, the structure of the organic EL device of the present invention is by no means limited to one illustrated in the drawings.

The FIGURE is a sectional view for illustrating an example of the structure of a general organic EL device to be used in the present invention. Reference numeral 1 represents a substrate, reference numeral 2 represents an anode, reference numeral 3 represents a hole-injecting layer, reference numeral 4 represents a hole-transporting layer, reference numeral 5 represents a light-emitting layer, reference numeral 6 represents an electron-transporting layer, and reference numeral 7 represents a cathode. The organic EL device of the present invention may include an exciton-blocking layer adjacent to the light-emitting layer, or may include an electron-blocking layer between the light-emitting layer and the hole-injecting layer. The exciton-blocking layer may be inserted on any of the anode side and the cathode side of the light-emitting layer, and may also be inserted simultaneously on both sides. The organic EL device of the present invention includes the substrate, the anode, the light-emitting layer, and the cathode as its essential layers. The organic EL device of the present invention preferably includes a hole-injecting/transporting layer and an electron-injecting/transporting layer in addition to the essential layers, and more preferably includes a hole-blocking layer between the light-emitting layer and the electron-injecting/transporting layer. The hole-injecting/transporting layer means any one or both of the hole-injecting layer and the hole-transporting layer, and the electron-injecting/transporting layer means any one or both of an electron-injecting layer and the electron-transporting layer.

It is possible to adopt a reverse structure as compared to the FIGURE, that is, the reverse structure being formed by laminating the layers on the substrate 1 in the order of the cathode 7, the electron-transporting layer 6, the light-emitting layer 5, the hole-transporting layer 4, the hole-injecting layer 3, and the anode 2. In this case as well, some layers may be added or eliminated as required.

—Substrate—

The organic EL device of the present invention is preferably supported by a substrate. The substrate is not particularly limited, and any substrate that has long been conventionally used for an organic EL device may be used. For example, a substrate made of glass, a transparent plastic, quartz, or the like may be used.

—Anode—

Preferably used as the anode in the organic EL device is an anode formed by using, as an electrode substance, any of a metal, an alloy, an electrically conductive compound, and a mixture thereof, all of which have a large work function (4 eV or more). Specific examples of such electrode substance include metals such as Au and conductive transparent materials, such as CuI, indium tin oxide (ITO), $SnO_2$, and ZnO. In addition, a material such as IDIXO ($In_2O_3$—ZnO), which can produce an amorphous, transparent conductive film, may be used. In order to produce the anode, it may be possible to form any of those electrode substances into a thin film by using a method such as vapor deposition or sputtering and form a pattern having a desired shape thereon by photolithography. Alternatively, in the case of not requiring high pattern accuracy (about 100 μm or more), a pattern may be formed via a mask having a desired shape when any of the above-mentioned electrode substances is subjected to vapor deposition or sputtering. Alternatively, when a coatable substance, such as an organic conductive compound, is used, a wet film-forming method, such as a printing method or a coating method, may be used. When luminescence is taken out from the anode, the transmittance of the anode is desirably controlled to more than 10%. In addition, the sheet resistance of the anode is preferably several hundred ohms per square ($\Omega/\square$) or less. Further, the thickness of the film is, depending on its material, selected from the range of generally from 10 nm to 1,000 nm, preferably from 10 nm to 200 nm.

—Cathode—

Meanwhile, used as the cathode is a cathode formed by using, as an electrode substance, any of a metal (referred to as electron-injecting metal), an alloy, an electrically conductive compound, and a mixture thereof, all of which have a small work function (4 eV or less). Specific examples of such electrode substance include sodium, a sodium-potassium alloy, magnesium, lithium, a magnesium/copper mixture, a magnesium/silver mixture, a magnesium/aluminum mixture, a magnesium/indium mixture, an aluminum/aluminum oxide ($Al_2O_3$) mixture, indium, a lithium/aluminum mixture, and a rare earth metal. Of those, for example, a mixture of an electron-injecting metal and a second metal, which is a stable metal having a larger work function value than the former metal, such as a magnesium/silver mixture, a magnesium/aluminum mixture, a magnesium/indium mixture, an aluminum/aluminum oxide ($Al_2O_3$) mixture, or a lithium/aluminum mixture, or aluminum, is suitable from the viewpoints of an electron-injecting property and durability against oxidation or the like. The cathode may be produced by forming any of those electrode substances into a thin film by using a method such as vapor deposition or sputtering. In addition, the sheet resistance of the cathode is preferably several hundred $\Omega/\square$ or less, and the thickness of the film is selected from the range of generally from 10 nm to 5 μm, preferably from 50 nm to 200 nm. In order for luminescence produced to pass through, any one of the anode and cathode of the organic EL device is preferably transparent or semi-transparent, because the light emission luminance improves.

In addition, after the above-mentioned metal has been formed into a film having a thickness of from 1 nm to 20 nm as a cathode, the conductive transparent material mentioned in the description of the anode is formed into a film on the cathode, thereby being able to produce a transparent or semi-transparent cathode. Through the application of this, a device in which both the anode and cathode have transparency can be produced.

—Light-Emitting Layer—

The light-emitting layer is a layer that emits light after the production of an exciton by the recombination of a hole injected from the anode and an electron injected from the cathode, and the light-emitting layer contains an organic light-emitting material and a host material.

When the light-emitting layer is a fluorescent light-emitting layer, at least one kind of fluorescent light-emitting material may be used alone as the fluorescent light-emitting material. However, it is preferred that the fluorescent light-emitting material be used as a fluorescent light-emitting dopant and the host material be contained.

The carborane compound represented by the general formula (1) may be used as the fluorescent light-emitting material in the light-emitting layer. However, the fluorescent light-emitting material is known through, for example, many patent literatures, and hence may be selected therefrom. Examples thereof include a benzoxazole derivative, a benzothiazole derivative, a benzimidazole derivative, a styrylbenzene derivative, a polyphenyl derivative, a diphenylbutadiene derivative, a tetraphenylbutadiene derivative, a naphthalimide derivative, a coumarin derivative, a fused aromatic compound, a perinone derivative, an oxadiazole derivative, an oxazine derivative, an aldazine derivative, a pyrrolidine derivative, a cyclopentadiene derivative, a bisstyrylanthracene derivative, a quinacridone derivative, a pyrrolopyridine derivative, a thiadiazolopyridine derivative, a styrylamine derivative, a diketopyrrolopyrrole derivative, an aromatic dimethylidene compound, various metal complexes typified by a metal complex of an 8-quinolinol derivative, and a metal complex, rare earth complex, or transition metal complex of a pyrromethene derivative, polymer compounds, such as polythiophene, polyphenylene, and polyphenylene vinylene, and an organic silane derivative. Of those, for example, the following compound is preferred: a fused aromatic compound, a styryl compound, a diketopyrrolopyrrole compound, an oxazine compound, or a pyrromethene metal complex, transition metal complex, or lanthanoid complex. For example, the following compound is more preferred: naphthacene, pyrene, chrysene, triphenylene, benzo[c]phenanthrene, benzo[a]anthracene, pentacene, perylene, fluoranthene, acenaphthofluoranthene, dibenzo[a,j]anthracene, dibenzo[a,h]anthracene, dibenzo[a,h]anthracene, benzo[a]naphthacene, hexacene, anthanthrene, naphtho[2,1-f]isoquinoline, α-naphthaphenanthridine, phenanthroxazole, quinolino[6,5-f]quinoline, or benzothiophanthrene. Those compounds may each have an alkyl group, an aryl group, an aromatic heterocyclic group, or a diarylamino group as a substituent.

The carborane compound represented by the general formula (1) may be used as a fluorescent host material in the light-emitting layer. However, the fluorescent host material is known through, for example, many patent literatures, and hence may be selected therefrom. For example, the following material may be used: a compound having a fused aryl ring, such as naphthalene, anthracene, phenanthrene, pyrene, chrysene, naphthacene, triphenylene, perylene, fluoranthene, fluorene, or indene, or a derivative thereof; an aromatic amine derivative, such as N,N'-dinaphthyl-N,N'-diphenyl-4,4'-diphenyl-1,1'-diamine; a metal chelated oxinoid compound typified by tris(8-quinolinato)aluminum (III); a bisstyryl derivative, such as a distyrylbenzene derivative; a tetraphenylbutadiene derivative; an indene derivative; a coumarin derivative; an oxadiazole derivative; a pyrrolopyridine derivative; a perinone derivative; a cyclopentadiene derivative; a pyrrolopyrrole derivative; a thiadiazolopyridine derivative; a dibenzofuran derivative; a carbazole derivative; an indolocarbazole derivative; a triazine derivative; or a polymer-based derivative, such as a polyphenylene vinylene derivative, a poly-p-phenylene derivative, a polyfluorene derivative, a polyvinyl carbazole derivative, or a polythiophene derivative. However, the fluorescent host material is not particularly limited thereto.

When the fluorescent light-emitting material is used as a fluorescent light-emitting dopant and the host material is contained, the content of the fluorescent light-emitting dopant in the light-emitting layer desirably falls within the range of from 0.01 wt % to 20 wt %, preferably from 0.1 wt % to 10 wt %.

An organic EL device typically injects charges from both of its electrodes, i.e., its anode and cathode into a light-emitting substance to produce a light-emitting substance in an excited state, and causes the substance to emit light. In the case of a charge injection-type organic EL device, it is said that 25% of the produced excitons are excited to a singlet excited state and the remaining 75% of the excitons are excited to a triplet excited state. As disclosed in Advanced Materials 2009, 21, 4802-4806, it has been known that after a specific fluorescent light-emitting substance has undergone an energy transition to a triplet excited state as a result of intersystem crossing or the like, the substance is subjected to inverse intersystem crossing to a singlet excited state by triplet-triplet annihilation or the absorption of thermal energy to radiate fluorescence, thereby expressing thermally activated delayed fluorescence. The organic EL device of the present invention can also express delayed fluorescence. In this case, the light emission may include both fluorescent light emission and delayed fluorescent light emission. Light emission from the host material may be present in part of the light emission.

When the light-emitting layer is a delayed fluorescent light-emitting layer, at least one kind of delayed fluorescent light-emitting material may be used alone as a delayed fluorescent light-emitting material. However, it is preferred that the delayed fluorescent light-emitting material be used as a delayed fluorescent light-emitting dopant and the host material be contained.

The carborane compound represented by the general formula (1) may be used as the delayed fluorescent light-emitting material in the light-emitting layer. However, a material selected from known delayed fluorescent light-emitting materials may also be used. Examples thereof include a tin complex, an indolocarbazole derivative, a copper complex, and a carbazole derivative. Specific examples thereof include, but not limited to, compounds disclosed in the following non patent literatures and patent literature.

(1) Adv. Mater. 2009, 21, 4802-4806, (2) Appl. Phys. Lett. 98, 083302 (2011), (3) JP 2011-213643 A, and (4) J. Am. Chem. Soc. 2012, 134, 14706-14709.

Specific examples of the delayed fluorescent light-emitting material are shown below, but the delayed fluorescent light-emitting material is not limited to the following compounds.

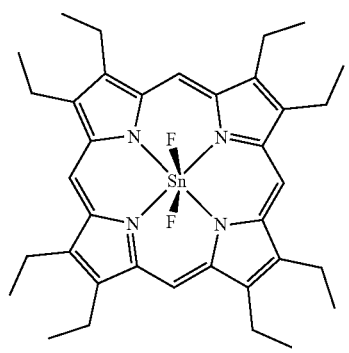

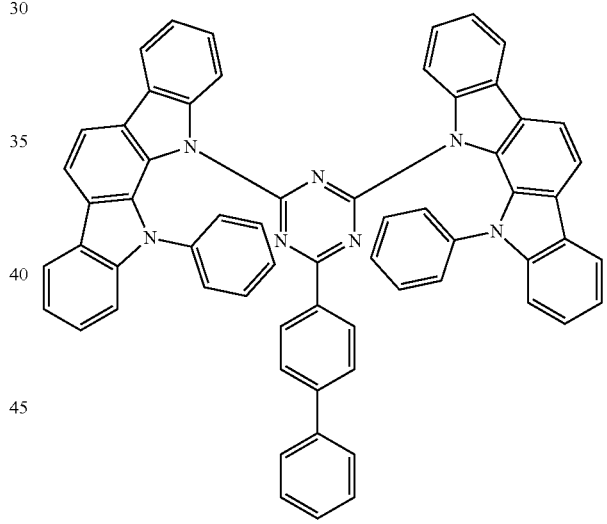

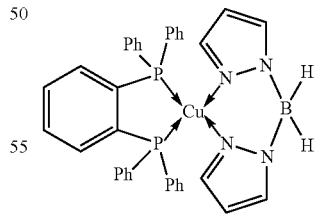

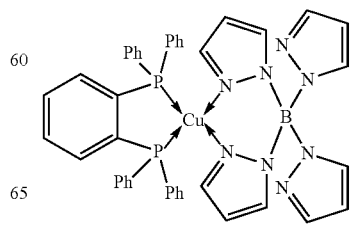

-continued

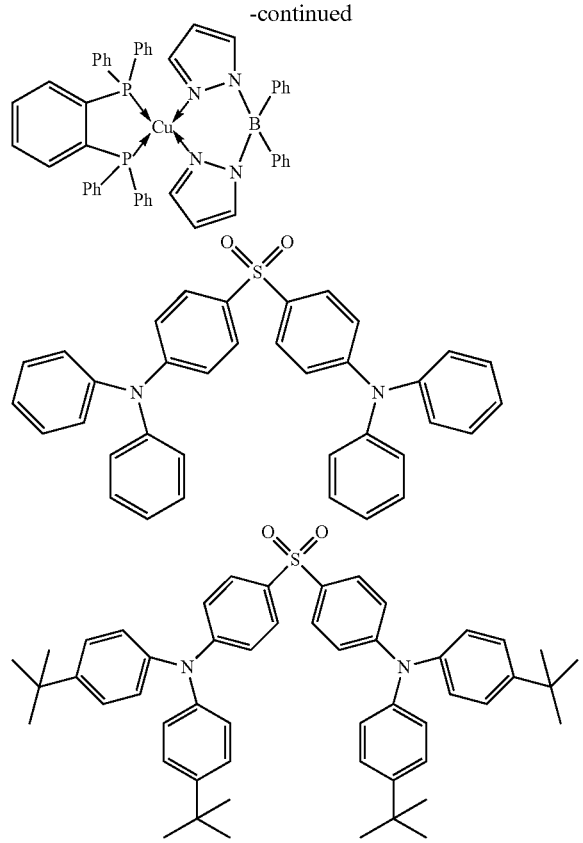

When the delayed fluorescent light-emitting material is used as a delayed fluorescent light-emitting dopant and the host material is contained, the content of the delayed fluorescent light-emitting dopant in the light-emitting layer desirably falls within the range of from 0.01 wt % to 50 wt %, preferably from 0.1 wt % to 20 wt %, more preferably from 0.01% to 10%.

The carborane compound represented by the general formula (1) may be used as the delayed fluorescent host material in the light-emitting layer. However, the delayed fluorescent host material may also be selected from compounds except the carborane compound of the present invention. For example, the following compound may be used: a compound having a fused aryl ring, such as naphthalene, anthracene, phenanthrene, pyrene, chrysene, naphthacene, triphenylene, perylene, fluoranthene, fluorene, or indene, or a derivative thereof; an aromatic amine derivative, such as N,N'-dinaphthyl-N,N'-diphenyl-4,4'-diphenyl-1,1'-diamine; a metal chelated oxinoid compound typified by tris(8-quinolinato)aluminum(III); a bisstyryl derivative, such as a distyrylbenzene derivative; a tetraphenylbutadiene derivative; an indene derivative; a coumarin derivative; an oxadiazole derivative; a pyrrolopyridine derivative; a perinone derivative; a cyclopentadiene derivative; a pyrrolopyrrole derivative; a thiadiazolopyridine derivative; a dibenzofuran derivative; a carbazole derivative; an indolocarbazole derivative; a triazine derivative; or a polymer-based derivative, such as a polyphenylene vinylene derivative, a poly-p-phenylene derivative, a polyfluorene derivative, a polyvinyl carbazole derivative, a polythiophene derivative, or an arylsilane derivative. However, the delayed fluorescent host material is not particularly limited thereto.

When the light-emitting layer is a phosphorescent light-emitting layer, the light-emitting layer contains a phosphorescent light-emitting dopant and a host material. It is recommended to use, as a material for the phosphorescent light-emitting dopant, a material containing an organic metal complex including at least one metal selected from ruthenium, rhodium, palladium, silver, rhenium, osmium, iridium, platinum, and gold.

Preferred examples of the phosphorescent light-emitting dopant include complexes such as Ir(ppy)$_3$, complexes such as Ir(bt)$_2$.acac$_3$, and complexes such as PtOEt$_3$, the complexes each having a noble metal element, such as Ir, as a central metal. Specific examples of those complexes are shown below, but the complexes are not limited to the following compounds.

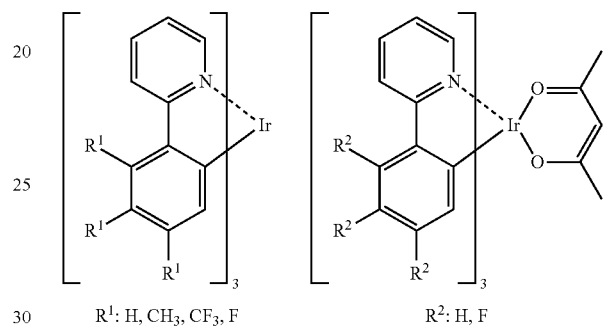

R$^1$: H, CH$_3$, CF$_3$, F       R$^2$: H, F

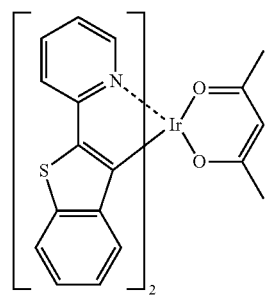

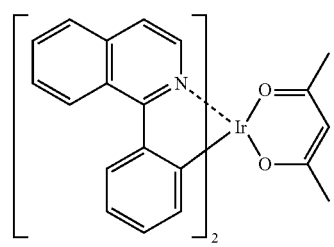

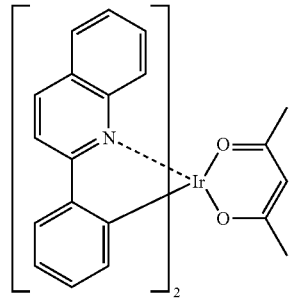

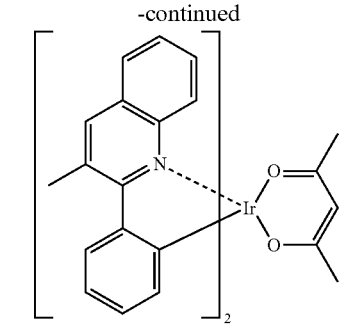
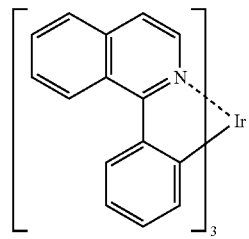
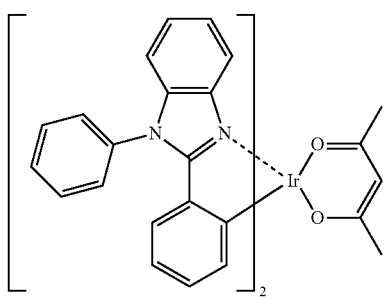
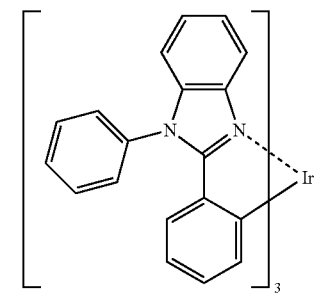
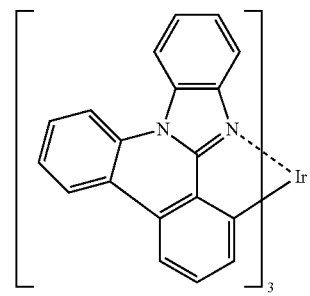
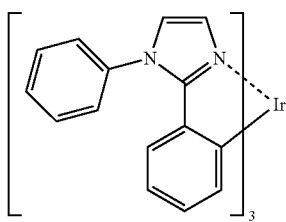
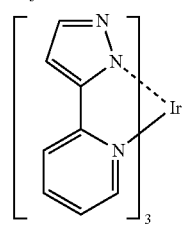
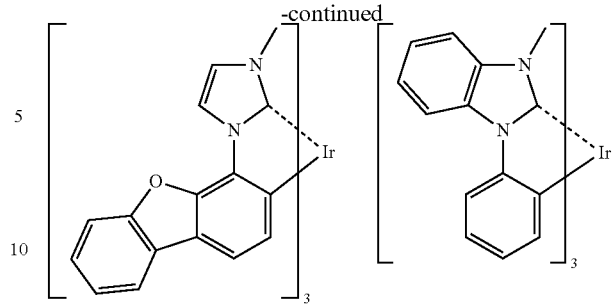
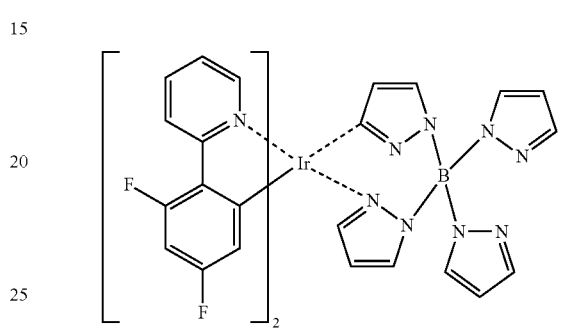
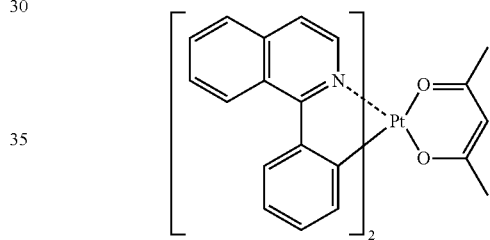
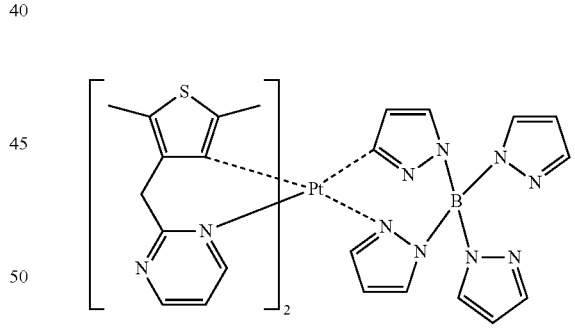
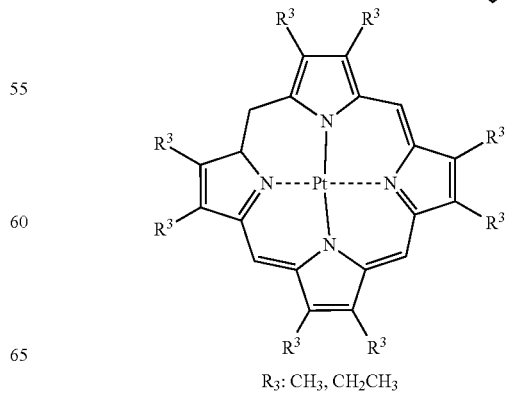
R$_3$: CH$_3$, CH$_2$CH$_3$ -continued

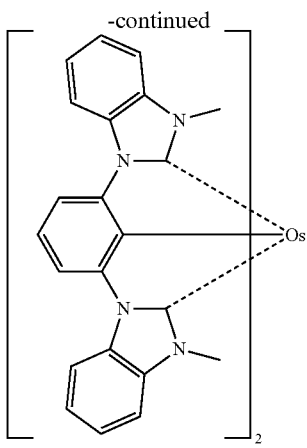

It is desired that the content of the phosphorescent light-emitting dopant in the light-emitting layer fall within the range of from 2 wt % to 40 wt %, preferably from 5 wt % to 30 wt %.

When the light-emitting layer is a phosphorescent light-emitting layer, it is preferred to use, as a host material in the light-emitting layer, the carborane compound represented by the general formula (1) according to the present invention. However, when the carborane compound is used in any other organic layer except the light-emitting layer, the material to be used in the light-emitting layer may be the carborane compound or any other host material except the carborane compound. In addition, the carborane compound may be used in combination with any other host material. Further, a plurality of kinds of known host materials may be used in combination.

It is preferred to use, as a known host compound that may be used, a compound that has a hole-transporting ability or an electron-transporting ability, is capable of preventing luminescence from having a longer wavelength, and has a high glass transition temperature.

Any such other host material is known through, for example, many patent literatures, and hence may be selected therefrom. Specific examples of the host material include, but not particularly limited to an indole derivative, a carbazole derivative, an indolocarbazole derivative, a triazole derivative, an oxazole derivative, an oxadiazole derivative, an imidazole derivative, a polyarylalkane derivative, a pyrazoline derivative, a pyrazolone derivative, a phenylenediamine derivative, an arylamine derivative, an amino-substituted chalcone derivative, a styrylanthracene derivative, a fluorenone derivative, a hydrazone derivative, a stilbene derivative, a silazane derivative, an aromatic tertiary amine compound, a styrylamine compound, an aromatic dimethylidene-based compound, a porphyrin-based compound, an anthraquinodimethane derivative, an anthrone derivative, a diphenylquinone derivative, a thiopyran dioxide derivative, a carborane derivative, a heterocyclic tetracarboxylic acid anhydride, such as naphthalene perylene, various metal complexes typified by metal complexes of a phthalocyanine derivative and an 8-quinolinol derivative, and metal complexes of metal phthalocyanine, benzoxazole, and benzothiazole derivatives, and polymer compounds, such as a polysilane-based compound, a poly(N-vinylcarbazole) derivative, an aniline-based copolymer, a thiophene oligomer, a polythiophene derivative, a polyphenylene derivative, a polyphenylenevinylene derivative, and a polyfluorene derivative.

The light-emitting layer, which may be any one of a fluorescent light-emitting layer, a delayed fluorescent light-emitting layer, and a phosphorescent light-emitting layer, is preferably the phosphorescent light-emitting layer.

—Injecting Layer—

The injecting layer refers to a layer formed between an electrode and an organic layer for the purposes of lowering a driving voltage and improving light emission luminance, and includes a hole-injecting layer and an electron-injecting layer. The injecting layer may be interposed between the anode and the light-emitting layer or the hole-transporting layer, or may be interposed between the cathode and the light-emitting layer or the electron-transporting layer. The injecting layer may be formed as required.

—Hole-Blocking Layer—

The hole-blocking layer has, in a broad sense, the function of an electron-transporting layer, and is formed of a hole-blocking material that has a remarkably small ability to transport holes while having a function of transporting electrons, and hence the hole-blocking layer is capable of improving the probability of recombining an electron and a hole by blocking holes while transporting electrons.

It is preferred to use the carborane compound represented by the general formula (1) according to the present invention for the hole-blocking layer. However, when the carborane compound is used in any other organic layer, a known material for a hole-blocking layer may be used. In addition, a material for the electron-transporting layer to be described later may be used as a material for the hole-blocking layer as required.

—Electron-Blocking Layer—

The electron-blocking layer is formed of a material that has a remarkably small ability to transport electrons while having a function of transporting holes, and hence the electron-blocking layer is capable of improving the probability of recombining an electron and a hole by blocking electrons while transporting holes.

A material for the hole-transporting layer to be described later may be used as a material for the electron-blocking layer as required. The thickness of the electron-blocking layer is preferably from 3 nm to 100 nm, more preferably from 5 nm to 30 nm.

—Exciton-Blocking Layer—

The exciton-blocking layer refers to a layer for blocking excitons produced by the recombination of a hole and an electron in the light-emitting layer from diffusing into charge-transporting layers. The insertion of this layer enables efficient confinement of the excitons in the light-emitting layer, thereby being able to improve the luminous efficiency of the device. The exciton-blocking layer may be inserted on any of the anode side and the cathode side of the adjacent light-emitting layer, and may also be inserted simultaneously on both sides.

The carborane compound represented by the general formula (1) may be used as a material for the exciton-blocking layer. However, as other materials therefor, there are given, for example, 1,3-dicarbazolylbenzene (mCP) and bis(2-methyl-8-quinolinolato)-4-phenylphenolatoaluminum (III) (BAlq).

—Hole-Transporting Layer—

The hole-transporting layer is formed of a hole-transporting material having a function of transporting holes, and a single hole-transporting layer or a plurality of hole-transporting layers may be formed.

The hole-transporting material has a hole-injecting property or a hole-transporting property or has an electron-blocking property, and any of an organic material and an inorganic material may be used as the hole-transporting material. It is preferred to use the carborane compound represented by the general formula (1) as a known hole-transporting material that may be used. However, any compound selected from conventionally known compounds may be used. Examples of the known hole-transporting material that may be used include a triazole derivative, an oxadiazole derivative, an imidazole derivative, a polyarylalkane derivative, a pyrazoline derivative and a pyrazolone derivative, a phenylenediamine derivative, an arylamine derivative, an amino-substituted chalcone derivative, an oxazole derivative, a styrylanthracene derivative, a fluorenone derivative, a hydrazone derivative, a stilbene derivative, a silazane derivative, an aniline-based copolymer, and a conductive high-molecular oligomer, in particular, a thiophene oligomer. Of those, a porphyrin compound, an aromatic tertiary amine compound, or a styrylamine compound is preferably used, and an aromatic tertiary amine compound is more preferably used.

—Electron-Transporting Layer—

The electron-transporting layer is formed of a material having a function of transporting electrons, and a single electron-transporting layer or a plurality of electron-transporting layers may be formed.

An electron-transporting material (which also serves as a hole-blocking material in some cases) only needs to have a function of transferring electrons injected from the cathode into the light-emitting layer. It is preferred to use the carborane compound represented by the general formula (1) according to the present invention for the electron-transporting layer. However, any compound selected from conventionally known compounds may be used. Examples thereof include a nitro-substituted fluorene derivative, a diphenylquinone derivative, a thiopyran dioxide derivative, a carbodiimide, a fluorenylidenemethane derivative, anthraquinodimethane and anthrone derivatives, and an oxadiazole derivative. Further, a thiadiazole derivative prepared by substituting an oxygen atom on an oxadiazole ring with a sulfur atom in the oxadiazole derivative or a quinoxaline derivative that has a quinoxaline ring known as an electron withdrawing group may be used as the electron-transporting material. Further, a polymer material in which any such material is introduced in a polymer chain or is used as a polymer main chain may be used.

EXAMPLES

Now, the present invention is described in more detail by way of Examples. It should be appreciated that the present invention is not limited to Examples below and may be carried out in various forms as long as the various forms do not deviate from the gist of the present invention.

A carborane compound serving as a material for an organic electroluminescent device was synthesized according to the following route. The number of each compound corresponds to the number given to the chemical formula.

Example 1

A compound 99 was synthesized in accordance with the following reaction formulae.

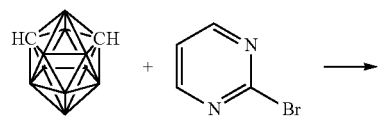

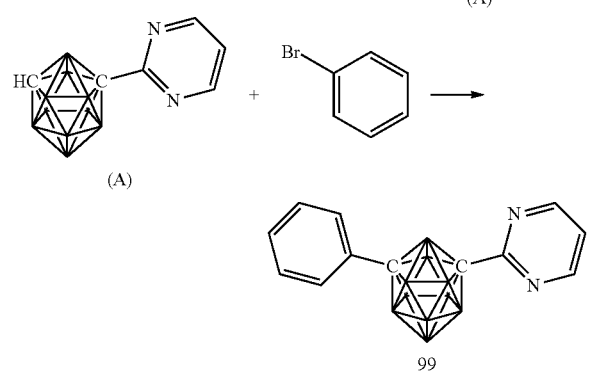

Under a nitrogen atmosphere, 35.0 g (0.243 mol) of m-carborane and 200 mL of 1,2-dimethoxyethane (DME) were added, and the resultant DME solution was cooled to 0° C. 96.8 mL of a 2.69 M solution of n-butyllithium in hexane was dropped to the solution, and the mixture was stirred under ice cooling for 30 min. 70 mL of pyridine was added to the resultant, and the mixture was stirred at room temperature for 10 min. After that, 75.6 g (0.763 mol) of copper(I) chloride was added to the resultant, and the mixture was stirred at 65° C. for 30 min. After that, 44.5 g (0.280 mol) of 2-bromopyridine was added to the resultant, and the mixture was stirred at 95° C. overnight. The reaction solution was cooled to room temperature. After that, the precipitated crystal was separated by filtration, and the solvent was distilled off under reduced pressure. The resultant residue was purified by silica gel column chromatography to provide 23.3 g (0.104 mmol, yield: 43.0%) of an intermediate A.

Under a nitrogen atmosphere, 5.49 g (0.0245 mol) of the intermediate A and 138 mL of 1,2-dimethoxyethane (DME) were added, and the resultant DME solution was cooled to 0° C. 9.89 mL of a 2.69 M solution of n-butyllithium in hexane was dropped to the solution, and the mixture was stirred under ice cooling for 30 min. 6.7 mL of pyridine was added to the resultant, and the mixture was stirred at room temperature for 10 min. After that, 7.56 g (76.0 mmol) of copper(I) chloride was added to the resultant, and the mixture was stirred at 65° C. for 30 min. After that, 4.11 g (0.0262 mol) of bromobenzene was added to the resultant, and the mixture was stirred at 95° C. for 2 d. The reaction solution was cooled to room temperature. After that, the precipitated crystal was separated by filtration, and the solvent was distilled off under reduced pressure. The resultant residue was purified by silica gel column chromatography to provide 1.47 g (4.90 mmol, yield: 20%) of the compound 99. APCI-TOFMS, m/z 301 $[M+H]^+$ Compounds 6, 9, 39, 53, 73, and 96, and compounds H-1 and H-2 for comparison were synthesized in conformity with the synthesis example and the synthesis method described herein. Organic EL devices were each produced by using the compound 99, 6, 9, 39, 53, 73, 96, H-1, or H-2.

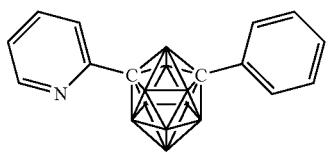

H-1

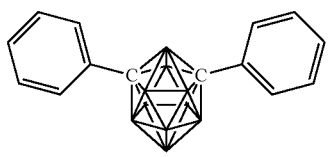

H-2

Example 2

Each thin film was laminated by a vacuum deposition method at a degree of vacuum of $2.0\times10^{-5}$ Pa on a glass substrate on which an anode formed of indium tin oxide (ITO) having a thickness of 70 nm had been formed. First, copper phthalocyanine (CuPC) was formed into a layer having a thickness of 30 nm to serve as a hole-injecting layer on the ITO. Next, diphenylnaphthyldiamine (NPD) was formed into a layer having a thickness of 15 nm to serve as a hole-transporting layer. Next, the compound 99 serving as a host material for a light-emitting layer and Ir(ppy)$_3$ serving as a dopant were co-deposited from different deposition sources onto the hole-transporting layer to form a light-emitting layer having a thickness of 30 nm. The concentration of Ir(ppy)$_3$ was 10 wt %. Next, Alq$_3$ was formed into a layer having a thickness of 25 nm to serve as an electron-transporting layer. Further, lithium fluoride (LiF) was formed into a layer having a thickness of 1 nm to serve as an electron-injecting layer on the electron-transporting layer. Finally, aluminum (Al) was formed into a layer having a thickness of 70 nm to serve as an electrode on the electron-injecting layer. Thus, an organic EL device was produced.

An external power source was connected to the resultant organic EL device to apply a DC voltage to the device. As a result, it was confirmed that the device had such light-emitting characteristics as shown in Table 1. The columns "luminance", "voltage", and "luminous efficiency" in Table 1 show values at the time of driving at 20 mA/cm$^2$ (initial characteristics). The maximum wavelength of the emission spectrum of the device was 530 nm, and hence the acquisition of light emission from Ir(ppy)$_3$ was found.

Examples 3 to 14

Organic EL devices were each produced in the same manner as in Example 2 except that the compound 6, 9, 39, 53, 73, 77, 78, 79, 85, 96, 105, or 114 was used as a host material for the light-emitting layer in Example 2 instead of the compound 99.

Comparative Examples 1 to 3

Organic EL devices were each produced in the same manner as in Example 2 except that CBP, H-1, or H-2 was used as a host material for the light-emitting layer in Example 2.

The organic EL devices obtained in Examples 3 to 14 and Comparative Examples 1 to 3 were evaluated in the same manner as in Example 2. As a result, it was confirmed that the devices had such light-emitting characteristics as shown in Table 1. The maximum wavelength of each of the emission spectra of the organic EL devices obtained in Examples 3 to 14 and Comparative Examples 1 to 3 was 530 nm, and hence the acquisition of light emission from Ir(ppy)$_3$ was identified.

TABLE 1

| | Host material Compound | Luminance (cd/m$^2$) | Voltage (V) | Visual luminous efficiency (lm/W) |
|---|---|---|---|---|
| Example 2 | 99 | 1,200 | 7.0 | 2.8 |
| Example 3 | 6 | 1,200 | 7.9 | 2.3 |
| Example 4 | 9 | 1,200 | 6.5 | 2.8 |
| Example 5 | 39 | 1,200 | 7.7 | 2.4 |
| Example 6 | 53 | 1,200 | 6.5 | 2.8 |
| Example 7 | 73 | 1,200 | 6.0 | 3.0 |
| Example 8 | 96 | 1,200 | 6.5 | 2.8 |
| Example 9 | 77 | 1,100 | 6.5 | 2.6 |
| Example 10 | 78 | 1,100 | 6.4 | 2.7 |
| Example 11 | 79 | 1,200 | 6.4 | 2.8 |
| Example 12 | 85 | 1,200 | 6.4 | 2.8 |
| Example 13 | 105 | 1,100 | 6.2 | 2.7 |
| Example 14 | 114 | 1,100 | 6.2 | 2.7 |
| Comparative Example 1 | CBP | 1,100 | 8.7 | 2.0 |
| Comparative Example 2 | H-1 | 1,100 | 8.8 | 2.0 |
| Comparative Example 3 | H-2 | 1,100 | 10.0 | 1.8 |

As can be seen from Table 1, in the case where the carborane compound of the present invention is used in a light-emitting layer (Examples 1 to 14), luminous efficiency more satisfactory than that in any other case (Comparative Examples 1 to 3) is shown.

Example 15

Each thin film was laminated by a vacuum deposition method at a degree of vacuum of $2.0\times10^{-5}$ Pa on a glass substrate on which an anode formed of indium tin oxide (ITO) having a thickness of 70 nm had been formed. First, copper phthalocyanine (CuPC) was formed into a layer having a thickness of 30 nm to serve as a hole-injecting layer on the ITO. Next, diphenylnaphthyldiamine (NPD) was formed into a layer having a thickness of 15 nm to serve as a hole-transporting layer. Next, CBP serving as a host material for a light-emitting layer and Ir(ppy)$_3$ serving as a dopant were co-deposited from different deposition sources onto the hole-transporting layer to form a light-emitting layer having a thickness of 30 nm. The concentration of Ir(ppy)$_3$ was 10%. Next, the compound 99 was formed into a layer having a thickness of 5 nm to serve as a hole-blocking layer on the light-emitting layer. Next, Alq$_3$ was formed into a layer having a thickness of 20 nm to serve as an electron-transporting layer. Further, lithium fluoride (LiF) was formed into a layer having a thickness of 1.0 nm to serve as an electron-injecting layer on the electron-transporting layer. Finally, aluminum (Al) was formed into a layer having a thickness of 70 nm to serve as an electrode on the electron-injecting layer. The resultant organic EL device has such a layer construction that in the organic EL device illustrated in FIG. 1 the FIGURE, the electron-injecting layer is added between the cathode and the electron-transporting layer, and the hole-blocking layer is added between the light-emitting layer and the electron-transporting layer.

An external power source was connected to the resultant organic EL device to apply a DC voltage to the device. As a result, it was confirmed that the device had such light-emitting characteristics as shown in Table 2. The columns "luminance", "voltage", and "luminous efficiency" in Table 2 show values at the time of driving at 20 mA/cm$^2$ (initial characteristics). The maximum wavelength of the emission spectrum of the device was 530 nm, and hence the acquisition of light emission from Ir(ppy)$_3$ was found.

Examples 16 to 27

Organic EL devices were each produced in the same manner as in Example 15 except that the compound 6, 9, 39, 53, 73, 77, 78, 79, 85, 96, 105, or 114 was used as a material for the hole-blocking layer in Example 15 instead of the compound 99.

Comparative Example 4

An organic EL device was produced in the same manner as in Example 15 except that: the thickness of Alq$_3$ serving as the electron-transporting layer in Example 15 was changed to 25 nm; and the hole-blocking layer was not formed.

Comparative Examples 5 and 6

Organic EL devices were each produced in the same manner as in Example 15 except that the compound H-1 or H-2 was used as a hole-blocking material in Example 15.

The organic EL devices obtained in Examples 16 to 27 and Comparative Examples 4 to 6 were evaluated in the same manner as in Example 15. As a result, it was confirmed that the devices had such light-emitting characteristics as shown in Table 2. The maximum wavelength of each of the emission spectra of the organic EL devices obtained in Examples 16 to 27 and Comparative Examples 4 to 6 was 530 nm, and hence the acquisition of light emission from Ir(ppy)$_3$ was identified. Each of the host materials for the light-emitting layers used in Examples 16 to 27 and Comparative Examples 4 to 6 is CBP.

TABLE 2

| | Hole-blocking material Compound | Luminance (cd/m$^2$) | Voltage (V) | Visual luminous efficiency (lm/W) |
|---|---|---|---|---|
| Example 15 | 99 | 1,400 | 7.5 | 3.0 |
| Example 16 | 6 | 1,200 | 8.5 | 2.1 |
| Example 17 | 9 | 1,400 | 7.0 | 3.2 |
| Example 18 | 39 | 1,200 | 8.2 | 2.3 |
| Example 19 | 53 | 1,300 | 7.0 | 2.8 |
| Example 20 | 73 | 1,400 | 6.5 | 3.5 |
| Example 21 | 96 | 1,400 | 6.9 | 3.2 |
| Example 22 | 77 | 1,300 | 6.9 | 2.8 |
| Example 23 | 78 | 1,400 | 6.9 | 3.3 |
| Example 24 | 79 | 1,400 | 6.9 | 3.3 |
| Example 25 | 85 | 1,400 | 6.9 | 3.2 |
| Example 26 | 105 | 1,300 | 6.7 | 3.0 |
| Example 27 | 114 | 1,300 | 6.6 | 3.1 |
| Comparative Example 4 | — | 1,100 | 8.7 | 2.0 |
| Comparative Example 5 | H-1 | 1,100 | 9.7 | 1.8 |
| Comparative Example 6 | H-2 | 1,100 | 10.9 | 1.6 |

As can be seen from Table 2, improvements in initial characteristics were observed in all systems as compared to Comparative Example 4 in which the hole-blocking material was not used. Of those, such a system that the carborane compound of the present invention is used in the hole-blocking layer shows satisfactory characteristics.

INDUSTRIAL APPLICABILITY

The material for an organic electroluminescent device of the present invention shows a satisfactory amorphous characteristic and high thermal stability, and at the same time, is extremely stable in an excited state. Accordingly, an organic EL device using the material has a long driving life and durability at a practical level.

REFERENCE SIGNS LIST

1 substrate, 2 anode, 3 hole-injecting layer, 4 hole-transporting layer, 5 light-emitting layer, 6 electron-transporting layer, 7 cathode

The invention claimed is:
1. A material for an organic electroluminescent device, comprising a carborane compound represented by the general formula (1):

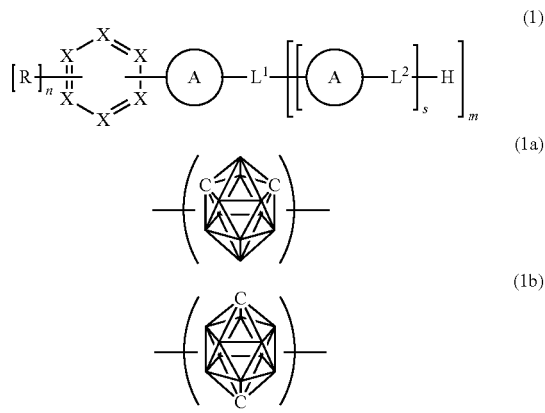

where:
rings A each independently represent a divalent carborane group $C_2B_{10}H_{10}$ represented by the formula (1a) or the formula (1b), s's each represent a number of repetitions and each independently represent an integer of from 1 to 4, and m and n each represent a substitution number, and m represents an integer of from 0 to 4, and n represents an integer of from 0 to 3, provided that when m=1, s=1;

X each independently represent N, CH, or C, and at least two of X's each represent N;

R represents an alkyl group having 1 to 12 carbon atoms, an alkoxy group having 1 to 12 carbon atoms, a substituted or unsubstituted aromatic hydrocarbon group having 6 to 30 carbon atoms, a substituted or unsubstituted aromatic heterocyclic group having 3 to 16 carbon atoms, or a linked aromatic group formed by linking 2 to 6 aromatic rings of the aromatic hydrocarbon group or the aromatic heterocyclic group;

L$^1$ and L$^2$ each independently represent a single bond, or a substituted or unsubstituted aromatic heterocyclic group having 3 to 16 carbon atoms, or a linked aromatic group formed by linking 2 to 6 aromatic rings of the aromatic heterocyclic group or substituted or unsubstituted aromatic hydrocarbon group having 6 to 30 carbon atoms, provided that, in the linked aromatic group, a ring to be directly bonded to the ring A is an aromatic heterocyclic ring, and when m=1, $L^1$ represents the aromatic heterocyclic group having a 1,3,5-triazine ring, a pyrimidine ring, a pyrazine ring, or a pyridazine ring, or the linked aromatic group containing at least one of the 1,3,5-triazine ring, pyrimidine ring, pyrazine ring, or pyridazine ring, or a single bond, and when a terminal comprises $L^1$-H or $L^2$-H, the $L^1$-H or $L^2$-H may represent an alkyl group having 1 to 12 carbon atoms or an alkoxy group having 1 to 12 carbon atoms;

provided that in each of $L^1$ and $L^2$, a ring to be directly bonded to the ring A is not a bicyclic nitrogen-containing heterocycle represented by the following formula (2), a dibenzothiophene ring, or a dibenzofuran ring:

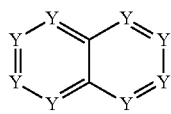

where Y each independently represent N, CH, or C, and one to four of Y each represent N.

2. A material for an organic electroluminescent device according to claim 1, wherein m represents an integer of 0 or 1.

3. A material for an organic electroluminescent device according to claim 1, wherein the rings A each represent a divalent carborane group $C_2B_{10}H_{10}$ represented by the formula (1a).

4. A material for an organic electroluminescent device according to claim 1, wherein $L^2$ represents a single bond or a linked aromatic group formed by linking 2 to 6 aromatic rings of a substituted or unsubstituted aromatic hydrocarbon group having 6 to 30 carbon atoms and a substituted or unsubstituted aromatic heterocyclic group having 3 to 16 carbon atoms.

5. A material for an organic electroluminescent device according to claim 1, wherein in the general formula (1), an aromatic ring formed of X comprises a pyrimidine ring, a pyrazine ring, a pyridazine ring, or a 1,3,5-triazine ring.

6. An organic electroluminescent device having a structure in which an anode, an organic layer, and a cathode are laminated on a substrate, the organic layer comprising an organic layer containing the material for an organic electroluminescent device of claim 1.

7. An organic electroluminescent device according to claim 6, wherein the organic layer containing the material for an organic electroluminescent device comprises at least one layer selected from the group consisting of a light-emitting layer, an electron-transporting layer, and a hole-blocking layer.

8. An organic electroluminescent device according to claim 7, wherein the organic layer containing the material for an organic electroluminescent device comprises a light-emitting layer containing a phosphorescent light-emitting dopant.

9. A material for an organic electroluminescent device according to claim 1, wherein s represents an integer of 1 or 2, and m represents an integer of 1 or 2.

10. A material for an organic electroluminescent device according to claim 9, wherein m represents an integer of 1.

11. A material for an organic electroluminescent device according to claim 1, wherein R, $L^1$, or $L^2$ is the linked aromatic group, and the number of aromatic rings is 2-4.

12. A material for an organic electroluminescent device according to claim 1, wherein $L^1$ is a linked aromatic group, and the number of aromatic rings is 2-4.

13. The material for an organic electroluminescent device according to claim 1, wherein the carborane compound represented by general formula (1) is

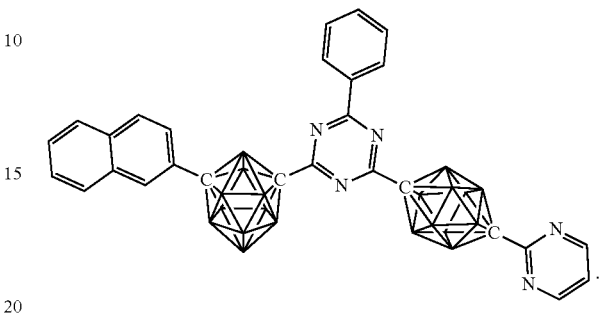

14. A material for an organic electroluminescent device, comprising a carborane compound represented by the general formula (1):

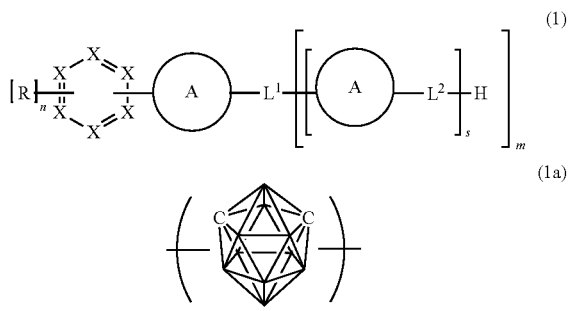

where:
rings A each independently represent a divalent carborane group $C_2B_{10}H_{10}$ represented by the formula (1a), s's each represent a number of repetitions and each independently represent an integer of from 1 to 2, and m and n each represent a substitution number, and m represents an integer of from 0 to 2, and n represents an integer of from 0 to 3, provided that when m=1, s=1;

X each independently represent N, CH, or C, and at least two of X's each represent N;

R represents an alkyl group having 1 to 12 carbon atoms, an alkoxy group having 1 to 12 carbon atoms, a substituted or unsubstituted aromatic hydrocarbon group having 6 to 30 carbon atoms, a substituted or unsubstituted aromatic heterocyclic group having 3 to 16 carbon atoms, or a linked aromatic group formed by linking 2 to 6 aromatic rings of the aromatic hydrocarbon group or the aromatic heterocyclic group;

$L^1$ and $L^2$ each independently represent an unsubstituted aromatic hydrocarbon group having 6 to 30 carbon atoms or a linked aromatic group formed by linking 2 to 6 aromatic rings of the unsubstituted aromatic hydrocarbon group.

15. The material for an organic electroluminescent device according to claim 14, wherein $L^1$ and $L^2$ each independently represent an unsubstituted aromatic hydrocarbon group having 6 to 30 carbon atoms or a linked aromatic group formed by linking 2 to 6 aromatic rings of the unsubstituted aromatic hydrocarbon group,
wherein the unsubstituted aromatic hydrocarbon group is groups each produced by removing at least one hydrogen atom from an aromatic hydrocarbon compound selected from benzene, naphthalene, fluorene, anthracene, anthryl, phenanthrene, triphenylene, tetraphenylene, fluoranthene, pyrene, and chrysene.

16. A material for an organic electroluminescent device, comprising a carborane compound represented by the general formula (1):

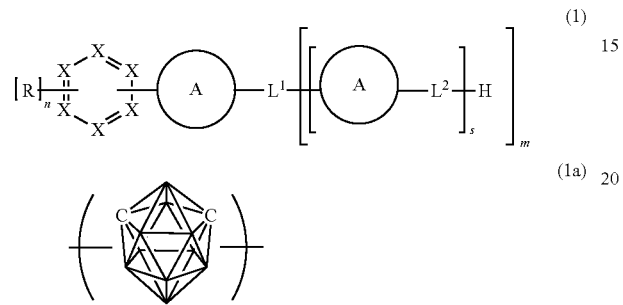

where:
rings A each independently represent a divalent carborane group $C_2B_{10}H_{10}$ represented by the formula (1a), s's each represent a number of repetitions and each independently represent an integer of from 1 to 2, and m and n each represent a substitution number, and m represents an integer of from 0 to 2, and n represents an integer of from 0 to 3, provided that when m=1, s=1;
X each independently represent N, CH, or C, and at least two of X's each represent N;
R represents a substituted or unsubstituted aromatic hydrocarbon group having 6 to 30 carbon atoms, a substituted or unsubstituted aromatic heterocyclic group having 3 to 16 carbon atoms, or a linked aromatic group formed by linking 2 to 6 aromatic rings of the aromatic hydrocarbon group or the aromatic heterocyclic group;
$L^1$ and $L^2$ each independently represent a single bond, or a substituted or unsubstituted N-containing monocyclic or tricyclic condensed aromatic heterocyclic group having 3 to 16 carbon atoms, or a linked aromatic group formed by linking 2 to 6 aromatic rings of the aromatic heterocyclic group or substituted or unsubstituted aromatic hydrocarbon group having 6 to 30 carbon atoms, provided that, in the linked aromatic group, a ring to be directly bonded to the ring A is an aromatic heterocyclic ring, and
in each of $L^1$, $L^2$, and R, the aromatic hydrocarbon group, the aromatic heterocyclic group, or the linked aromatic group may have a substituent wherein the substituent is an alkyl group having 1 to 12 carbon atoms, an alkoy group having 1 to 12 carbon atoms, or an acyl group having 2 to 13 carbon atoms.

17. The material for an organic electroluminescent device according to claim 16, wherein the unsubstituted aromatic hydrocarbon group is selected from the group consisting of benzene, naphthalene, fluorene, anthracene, anthryl, phenanthrene, triphenylene, tetraphenylene, fluoranthene, pyrene, and chrysene, and wherein the unsubstituted aromatic heterocyclic group is selected from the group consisting of pyridine, pyrimidine, pyrazine, pyridazine, triazine, quinoline, isoquinoline, quinoxaline, naphthyridine, carbazole, acridine, azepine, tribenzazepine, phenazine, dibenzofuran, dibenzothiophene, diazafluorene, phenoxazine, phenothiazine, dibenzophosphole, and dibenzoborole.

18. The material for an organic electroluminescent device according to claim 16, wherein the N-containing monocyclic or tricyclic condensed aromatic heterocyclic group having 3 to 16 carbon atoms is selected from the group consisting of pyridine, pyrimidine, pyrazine, pyridazine, triazine, carbazole, acridine, azepine, tribenzazepine, phenazine, diazafluorene, phenoxazine, and phenothiazine.

19. An organic electroluminescent device having a structure in which an anode, an organic layer, and a cathode are laminated on a substrate, the organic layer comprising an organic layer containing the material for an organic electroluminescent device of claim 16,
wherein the organic layer containing the material for an organic electroluminescent device comprises a light-emitting layer containing a phosphorescent light-emitting dopant.

* * * * *